(12) United States Patent
Sekiguchi et al.

(10) Patent No.: US 7,447,091 B2
(45) Date of Patent: Nov. 4, 2008

(54) SENSE AMPLIFIER FOR SEMICONDUCTOR MEMORY DEVICE

(75) Inventors: Tomonori Sekiguchi, Tama (JP); Shinichi Miyatake, Ome (JP); Takeshi Sakata, Hino (JP); Riichiro Takemura, Tokyo (JP); Hiromasa Noda, Tokyo (JP); Kazuhiko Kajigaya, Iruma (JP)

(73) Assignees: Hitachi, Ltd., Tokyo (JP); Elpida Memory, Inc., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 77 days.

(21) Appl. No.: 11/706,409

(22) Filed: Feb. 15, 2007

(65) Prior Publication Data

US 2007/0147152 A1    Jun. 28, 2007

Related U.S. Application Data

(63) Continuation of application No. 10/534,049, filed as application No. PCT/JP02/11659 on Nov. 8, 2002, now Pat. No. 7,200,061.

(51) Int. Cl.
*G11C 7/02* (2006.01)
(52) U.S. Cl. .................................... 365/207; 365/205
(58) Field of Classification Search .............. 365/207, 365/205, 208, 210.1
See application file for complete search history.

(56) References Cited

U.S. PATENT DOCUMENTS 5,274,598 A    12/1993    Fujii et al.
5,526,322 A *  6/1996    Lee .......................... 365/233.5
5,696,727 A * 12/1997    Tsukude et al. .............. 365/208
6,046,924 A    4/2000    Isobe et al.
6,088,276 A    7/2000    Ukita
6,147,918 A   11/2000    Takashima et al.
6,538,945 B2*  3/2003    Takemura et al. ........... 365/205
7,068,528 B2   6/2006    Won
2003/0128055 A1* 7/2003   Lin et al. ....................... 327/57
2006/0092735 A1  5/2006   Do et al.

FOREIGN PATENT DOCUMENTS

JP    05-054653    8/1991
JP    11-086549    9/1997
JP    11-306762    4/1998

* cited by examiner

*Primary Examiner*—Anh Phung
(74) *Attorney, Agent, or Firm*—Reed Smith LLP; Stanley P. Fisher, Esq.; Juan Carlos A. Marquez, Esq.

(57) ABSTRACT

A direct sense amplifier of the present invention incorporates and isolates: an MOS transistor serving as a differential pair and having a gate connected to a bit line; and an MOS transistor controlled by a column select line wired between RLIO lines in a bit-line direction, and further connects a source of the MOS transistor serving as the differential pair to a common source line wired in the word-line direction. Since the direct sense amplifier only in a select map is activated by the column select line and the common source line during an read operation, power consumption is significantly reduced during the read operation. Also, since a parasitic capacitance of the MOS transistor serving as the differential pair is separated from the local IO line, a load capacity of the local IO line is reduced and the read operation is speeded up. In addition, during the read operation, a data pattern dependency of the load capacity of the local IO line is reduced and a post-manufacture test is easily made.

2 Claims, 23 Drawing Sheets

SENSE AMPLIFIER FOR SEMICONDUCTOR MEMORY DEVICE

CROSS-REFERENCE TO RELATED APPLICATION

This application is a Continuation application of U.S. application Ser. No. 10/534,049 filed May 6, 2005 now U.S. Pat. No. 7,200,061, issued on Apr. 3, 2007. Priority is claimed based on U.S. application Ser. No. 10/534,049 filed May 6, 2005, which claims the priority of PCT/JP2002/11659 filed Nov. 8, 2002, the contents of which are hereby incorporated by reference into this application.

TECHNICAL FILED OF THE INVENTION

The present invention relates to a random access memory and, particularly, to a memory in which a signal read from a memory cell to a bit line is transmitted to a peripheral circuit at a high speed by a gate-input amplifier.

BACKGROUND OF THE INVENTION

Japanese Patent Laid-Open No. 11-306762 (hereinafter referred to as "Document") discloses, as shown in FIG. 23, an SRAM memory array in which each bit line BL/BLB is provided with a column sense amplifier CSA to be connected to a global bit line GBL/GBLB. In this structure, the column sense amplifier can be selectively activated by a sense amplifier activating signal S for each block and a Y address signal YB, so that power consumption can be reduced.

Prior to the present invention, the inventors of the present invention have studied a control method used in the case where a potential of a bit line of DRAM is detected by a differential, gate-receiving amplifier, i.e., by a so-called direct sense amplifier. They have noticed the following points to be considered when the amplifier control method in the above-mentioned Document is used for the direct sense amplifier of DRAM. Firstly, since large-sized MOS transistors MN 20 and MN 21 are directly connected to a global bit line (corresponding to a local IO line to be connected to an output of the direct sense amplifier in DRAM), a load capacity of the global bit line (local IO line) is increased. In the DRAM, a number of direct sense amplifiers, e.g., approximately 32 to 128 direct sense amplifiers are normally connected to the local IO line. Also, since the local IO line and a main IO line lying ahead have long distances and large loads and the gates of the MOS transistors serving as a differential pair are long in order to reduce a threshold voltage offset, the gate width of the MN 20 and MN 21 is required to be, for example, 4 μm or longer. Therefore, like the CSA as shown in FIG. 23, in the structure where all differential pairs of a non-selected direct sense amplifier are visible, the load capacity of the local IO line is heavy, so that an operation with a high speed is difficult.

Secondly, the bit-line pre-charge level of DRAM is half of a level VDL of a power-supply voltage or a level VDL obtained by lowering the power-supply voltage, that is, VDL/2. Therefore, when a negative signal occurs on the BL and the level of the BL is decreased to a level lower than VDL/2, the MN 21 is cut off and the channel capacitance of MN 21 is made invisible from the local IO line. However, when a positive signal occurs on the BL and the level of the BL is increased to a level higher than VDL/2, the MN 21 is conducted and the channel capacity is made visible. Therefore, the capacity of the local IO line is significantly changed depending on a data pattern on the bit line. That is, a operational speed is significantly changed depending on a operation condition, so that there is the problem that a post-manufacturing test is made complicated.

Therefore, a first object to be solved by the present invention is to have a configuration in which a direct sense amplifier in a random access memory such as DRAM or SRAM can be selectively activated, wherein the load capacity of a local IO line is reduced and also its data pattern dependency is reduced. Also, a second problem to be solved by the present invention is to reduce noise in the direct sense amplifier in performing an operation at a high speed and to increase an operation margin. Furthermore, a third problem in the present invention is to double the number of bits to be read from a single memory array without increasing chip size.

The above and other objects and effects in the present invention will be apparent from the description of this specification and the accompanying drawings.

DISCLOSURE OF THE INVENTION

A representative configuration of the present invention will be described as follows.

That is, a semiconductor memory device comprises: first and second regions each including a word line extending in a first direction, first and second bit lines extending in a second direction intersecting with said first direction, a memory cell connected to said word line and said first and second bit lines, an amplifier circuit for amplifying information read from said memory cell, first and second IO lines for receiving the read information from said amplifier circuit, and a source line for controlling said amplifier circuit; and a column select line connected to said first and second regions in common and extending in said second direction, wherein said amplifier circuit includes first to fourth MOS transistors, a gate of said first MOS transistor is connected to said first bit line, a gate of said second MOS transistor is connected to said second bit line, and sources of said first and second MOS transistors are connected to said source line; a drain of said third MOS transistor is connected to said first IO line and a drain of said fourth MOS transistor is connected to said second IO line; gates of said third and fourth MOS transistors included respectively in the amplifier circuits are connected to said column select line in common; a drain of said first MOS transistor is connected to a source of said third MOS transistor; a drain of said second MOS transistor is connected to a source of said fourth MOS transistor; and in a first state, potentials of said first and second IO lines included in said first region are higher than a potential of the source line included in said first region, and the first and second IO lines included in said second region and the source line are equal in potential.

BEST MODE FOR CARRYING OUT THE INVENTION

Figure 1:
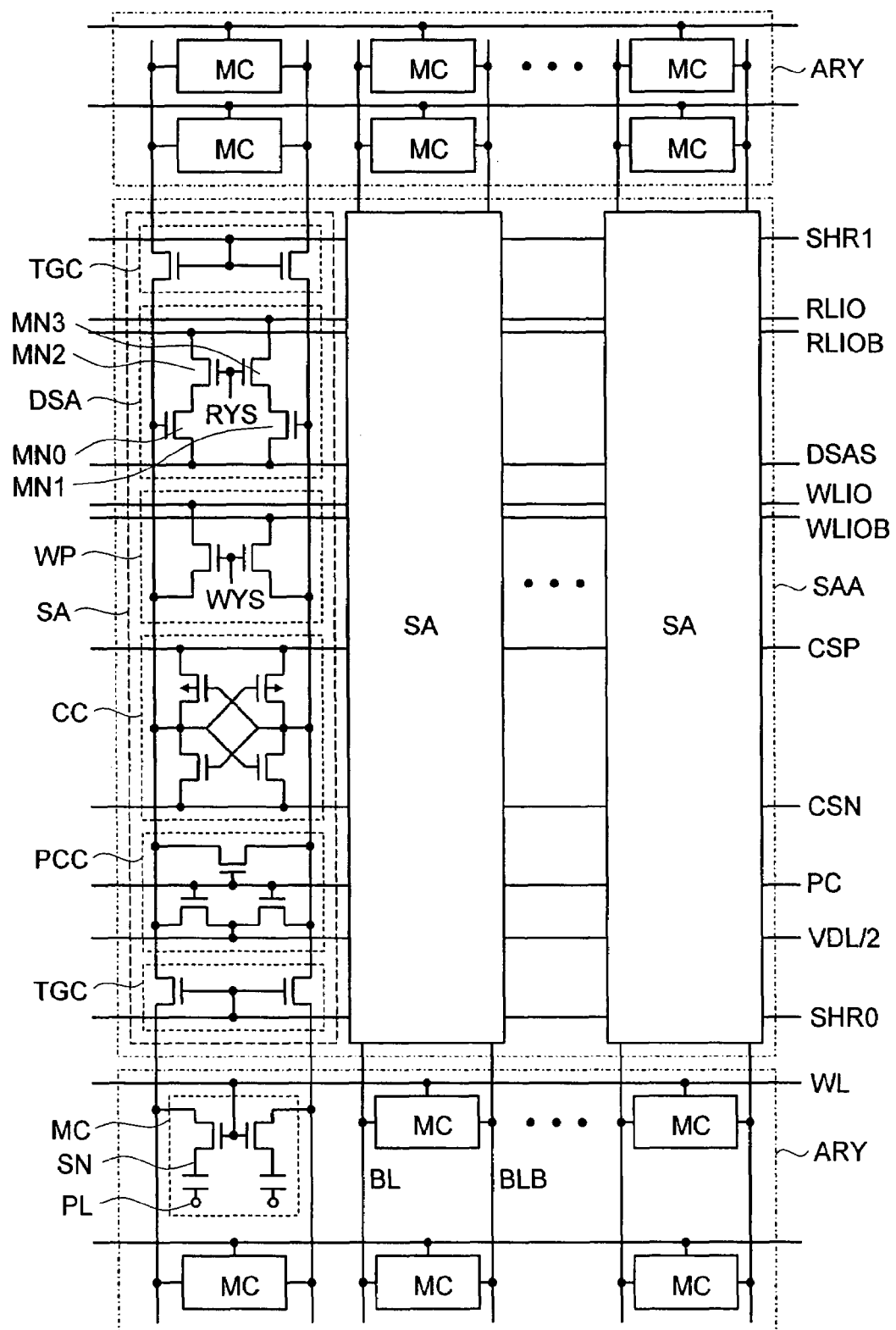
FIG. 1 shows memory arrays and sense amplifiers.

For describing the present invention at detail, it will be described based on the accompanying drawings. Note that, throughout all of the drawings for explaining embodiments, components having the same function are denoted by the same reference numeral and the repetition thereof will be omitted.

First Embodiment

Figure 2A:
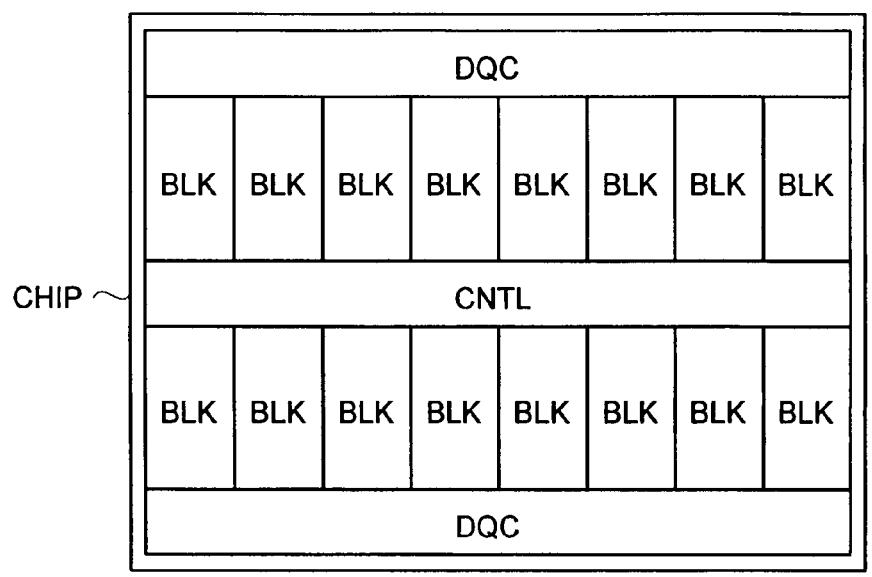
FIG. 2 shows a chip structure and a memory block structure of a semiconductor memory device according to the present invention.

FIG. 1 shows memory arrays ARY and sense amplifiers SA according to the present invention. To describe a function of the sense amplifier, a chip structure of a semiconductor memory device according to the present invention is shown in FIG. 2A. The entire chip CHIP is broadly divided into a control circuit CNTL, input/output circuits DQC, and memory blocks BLK. A clock, an address, and a control signal are supplied to the control circuit from the outside of the chip to determine an operation mode of the chip and pre-decode the address. The input/output circuit includes an input/output buffer, so that write date is inputted from the outside of the chip and read data is outputted to the outside of the chip.

Figure 2B:
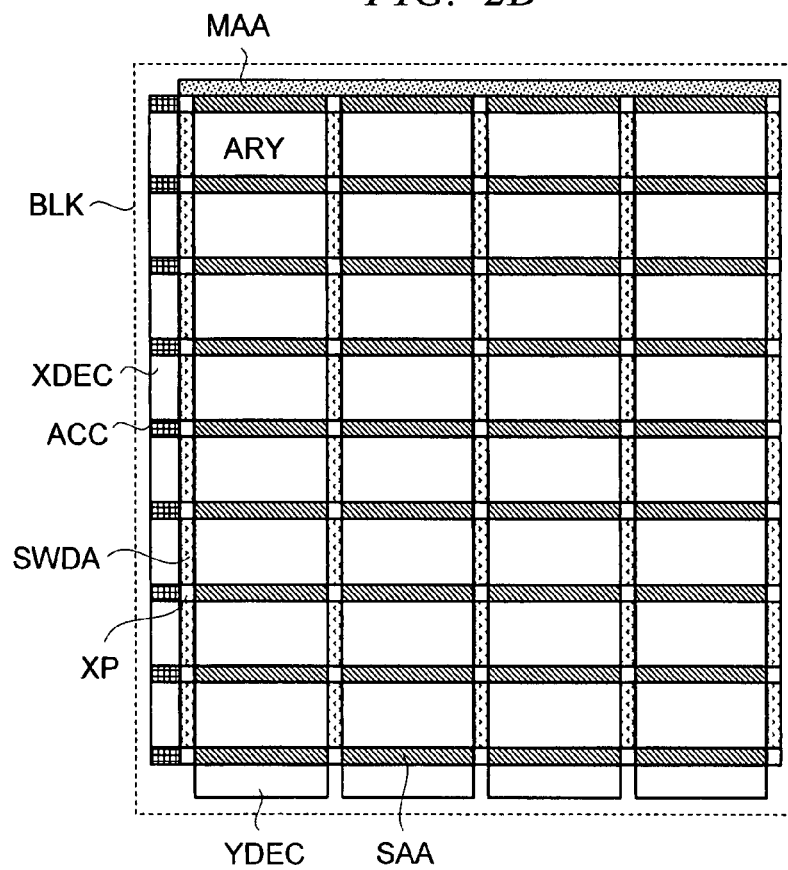

A structure of the memory block BLK is shown in FIG. 2B. On the memory block, memory arrays ARY are disposed on a plurality of arrays, and are each surrounded by sense amplifier columns SAA, sub-word driver columns SWDA, and cross areas XP. Also, column decoders YDEC and main amplifier columns MAA are disposed in an outer circumference so as to be parallel to the sense amplifier columns, and row decoders XDEC and array control circuits ACC are disposed so as to be parallel to the sub-word driver columns.

FIG. 1 shows two memory arrays and the sense amplifier columns disposed therebetween. The sense amplifier according to the present invention includes transfer gates TGC, a pre-charge circuit PCC, a restore amplifier CC, a write circuit WP, and an amplifier circuit, i.e., a direct sense amplifier DSA. The transfer gate is a circuit for connecting the sense amplifier and the memory arrays when a sense-amplifier separation signal SHR is activated. The pre-charge circuit equalizes a line between bit lines to be a pair when a pre-charge signal PC is activated and pre-charges it to a bit-line pre-charge level. The bit-line pre-charge level is normally set to a midpoint of a bit-line amplitude VDL (a level equal to a power supply voltage from the outside of the chip or a level obtained by lowering the power supply voltage), i.e., VDL/2. When the above-described twin-cell architecture is used, the pre-charge level can be set to a high level VDL or a low level VSS of the bit line even without using a dummy cell for generating a reference voltage. However, the direct sense amplifier, which will be described further below, has a high trans-conductance when the level of the bit line is approximately VDL/2, so that it is desirable that the bit-line pre-charge level is set to VDL/2 for a high-speed operation. The restore amplifier is a circuit which, after occurrence of a subtle read signal from the memory cell on the bit line, drives a P-side common source line CSP at the VDL and an N-side common source line CSN at the VSS and amplifies the high-voltage one of the bit lines BL and BLB to the VDL and the low-voltage one to the VSS.

The write circuit WP is a circuit for connecting write local IO lines WLIO/WLIOB and a bit-line pair when a write column select line WYS is activated. In order to prevent current consumption at the unselected sense amplifier column, the WLIO is pre-charged to the VBLR at a time of pre-charged period. The direct sense amplifier DSA is a circuit for driving read local IO lines RLIO/RLIOB by a subtle signal occurring on the bit line and for transmitting a signal. During the pre-charged period, the RLIO is pre-charged to an IO-line pre-charge level VPC. A direct-sense-amplifier common source line DSAS is pre-charged to an IO-line pre-charge level VPC during the pre-charged period and is driven at the VSS at a time of a read operation.

In the sense amplifier, when a read-column select line RYS is activated, the DSAS is driven at the VSS on the selected sense amplifier column and the DSAS is kept at the VPC on the non-selected sense amplifier column. Therefore, there is an advantage of being capable of activating only the selected sense amplifier and preventing the current consumption on the unselected sense amplifier. Also, in this amplifier, small-sized MOS transistors MN2 and MN3 (for example, each having a gate width of 1 μm) controlled by the RYS are disposed between each of large-sized MOS transistors MN0 and MN1 (for example, each having a gate width of 4 μm) serving as a differential pair having a bit line connected to their gates and the RLIO line, and are separated from each other. Therefore, in the unselected direct sense amplifier in which the RYS is set at the YSS, since the channel capacitance of the differential pair is not viewable from the RLIO line, it is possible to reduce a parasitic capacitance of the RLIO line and also prevent the parasitic capacitance from being changed depending on the data pattern on the bit line.

The memory array includes a plurality of memory cells MC. In this embodiment, the memory cell has a twin-cell architecture including two DRAM cells. The DRAM cell includes one MOS transistor and one capacitor, wherein one of a source and drain of the MOS transistor is connected to the bit line and the other of the source and drain is connected to a storage node SN and a gate thereof is connected to the word line. One terminal of the capacitor is connected to the storage node SN and the other terminal of the capacitor is connected to a plate electrode PL common to the other cells. In the twin cell, two DRAM cells are connected to the common word line and the bit lines to be a pair, and information is stored by writing complementary data in the storage node of each cell. In the following, the twin cell is used for describing the present invention. However, the sense amplifier according to the present invention can be applied to the case where one DRAM cell is used as a memory cell. When such a twin cell is used, a signal amount of bit line is approximately doubled in comparison with the case where only a single DRAM cell is used. When the direct sense amplifier as shown in FIG. 1 is used, the signal generated from the memory cell can be converted to a current difference by the direct sense amplifier without being amplified by the restore amplifier and then read to the local IO line. Therefore, as the signal amount on the bit line is larger, the signal amount to be read to the local IO line is larger. Thus, in a combination of the direct sense amplifier and the twin-cell architecture, the further enhanced speed can be achieved.

Figure 3A:
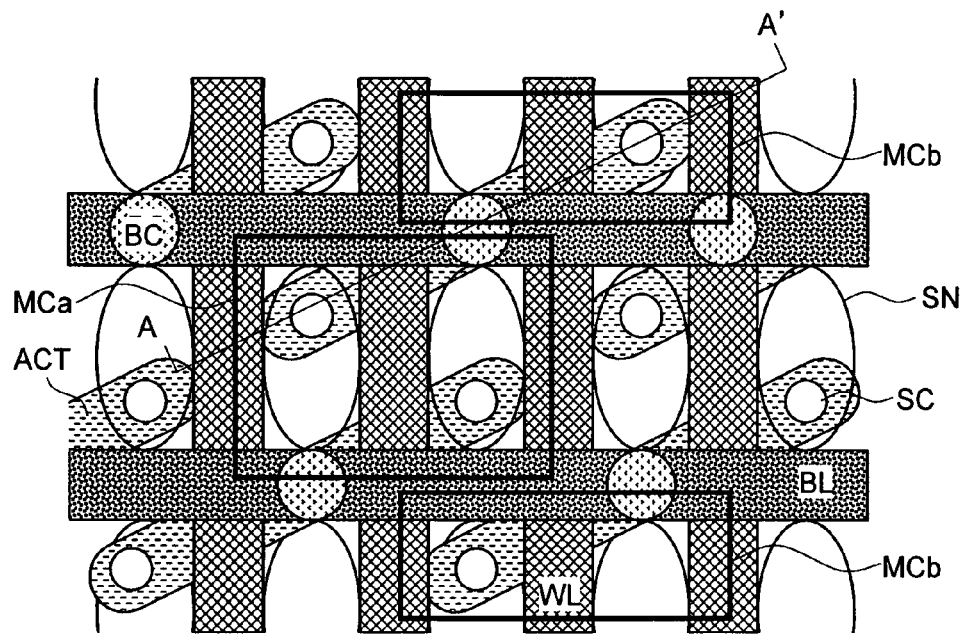
FIG. 3 shows a layout and a sectional view of a memory array.
Figure 3B:
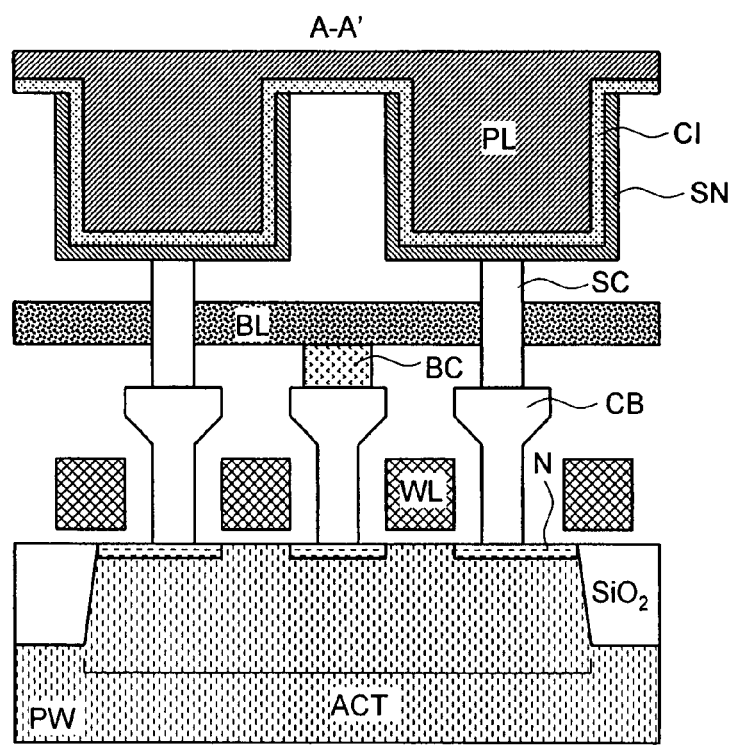

FIG. 3A shows a layout of the memory array and FIG. 3B shows a sectional view taken along the A-A' thereof. The DRAM cell includes an N-channel MOS transistor formed in a substrate PW, and a stack capacitor provided at an upper portion of the bit line BL. An active region of the MOS transistor is denoted by "ACT", a word line is denoted by "WL", and N-type diffusion layer region is denoted by "N". The active region is separated by an insulator of SiO2. Contacts CB are disposed at an upper portion of a diffusion layer, and a bit-line contact BC or a storage-node contact SC is disposed on the upper portion thereof. At an upper portion of the bit-line contact, the bit line BL is disposed in a direction orthogonal to the word lines. On the storage-node contact, the concave storage node SN is disposed. The plate electrode PL is embedded inside the storage node, and these form a capacitor in a state of sandwiching a capacitance insulating film CI therebetween. The present memory array is an open-bit-line type memory array in which the DRAM cells are connected to all intersection points of the bit line and the word line, so that the word line can be reduced to 2 F (F: minimum processing size) and the bit line pitch can be reduced to 3 F. In this embodiment, the two DRAM cells are used as a single memory cell to achieve a memory cell having a twin-cell architecture. However, there are the cases where two adjacent DRAM cells become a pair similarly to MCa and two separated DRAM cells become a pair similarly to MCb. Thus, when two cells each having one intersection point are used to form the twin cell, their cell size becomes the square of 12 F, so that an area thereof can be reduced in comparison with the case of using two cells each having two intersection points. Also, unlike the normal cells each having one intersection point, since the bit line to be a pair can be disposed on the same array, there is an advantage such that noise occurring during sensing, which becomes a problem in the cells each having one intersection point, can be prevented.

Figure 4:
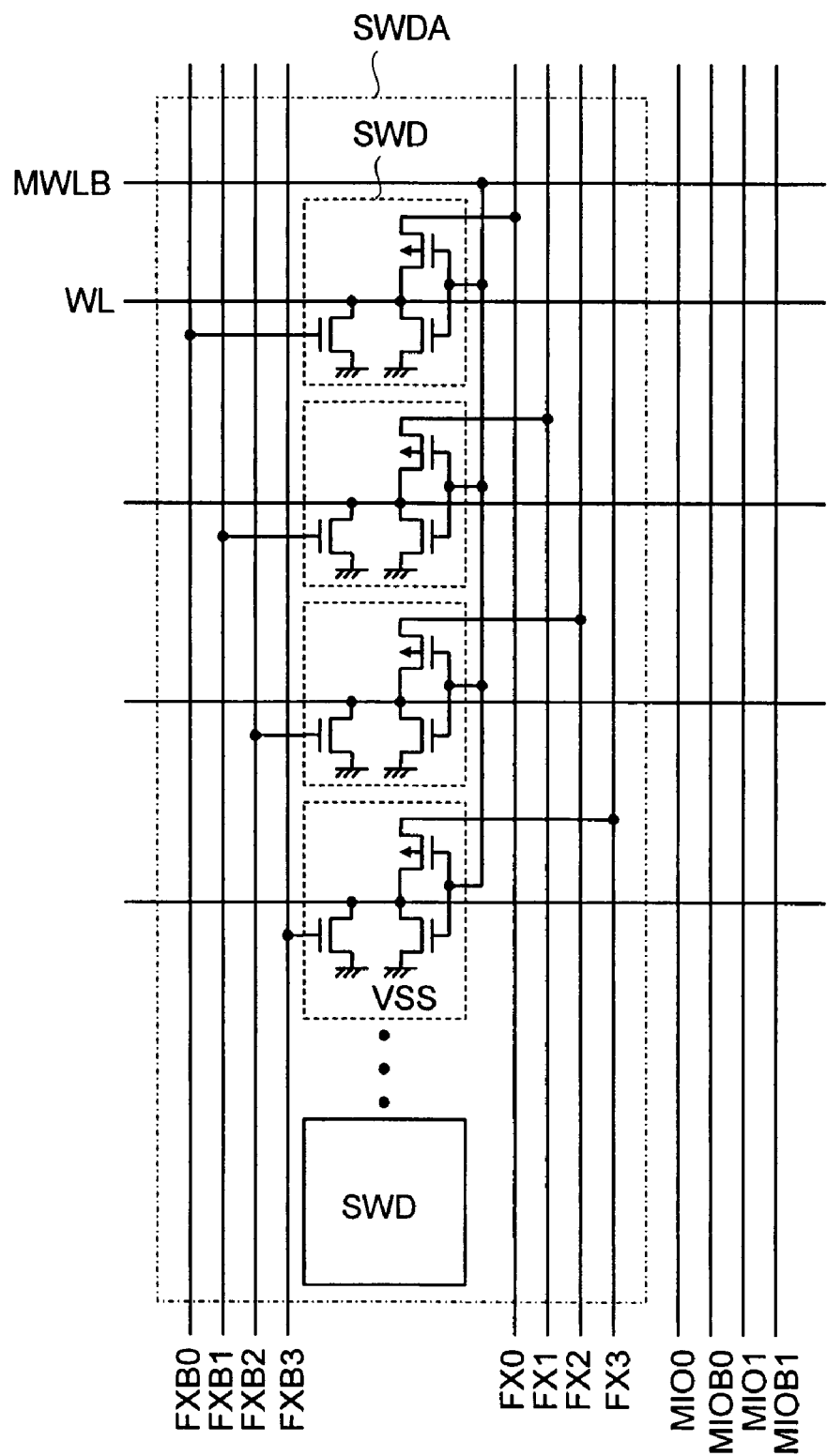
FIG. 4 is circuit diagrams of a sub-word driver and a sub-word driver array.

FIG. 4 is a circuit diagram of a sub-word driver SWD and a sub-word driver array SWDA configured by disposing a plurality of sub-word drivers. The sub-word driver includes two N-channel MOS transistors and one P-channel MOS transistor. One of the N-channel MOS transistors has a gate connected to a main word line MWLB, a drain connected to the word line WL, and a source connected to a ground VSS. The other of the N-channel MOS transistors has a gate connected to a complementary word-driver select line FXB, a drain connected to the word line WL, and a source connected to the ground potential VSS. The P-channel MOS transistor has a gate connected to the main word line MWLB, a drain connected to the word line WL, and a source connected to a word-driver select line FX. As shown in Figure, four lines FX are wired on one SWDA, and any one of four drivers SWD that is selected on one MWLB is selected to activate one WL. Also, in an upper portion of or a region adjacent to the sub-word driver column, main IO line pairs MIO/MIOB are wired.

Figure 5:
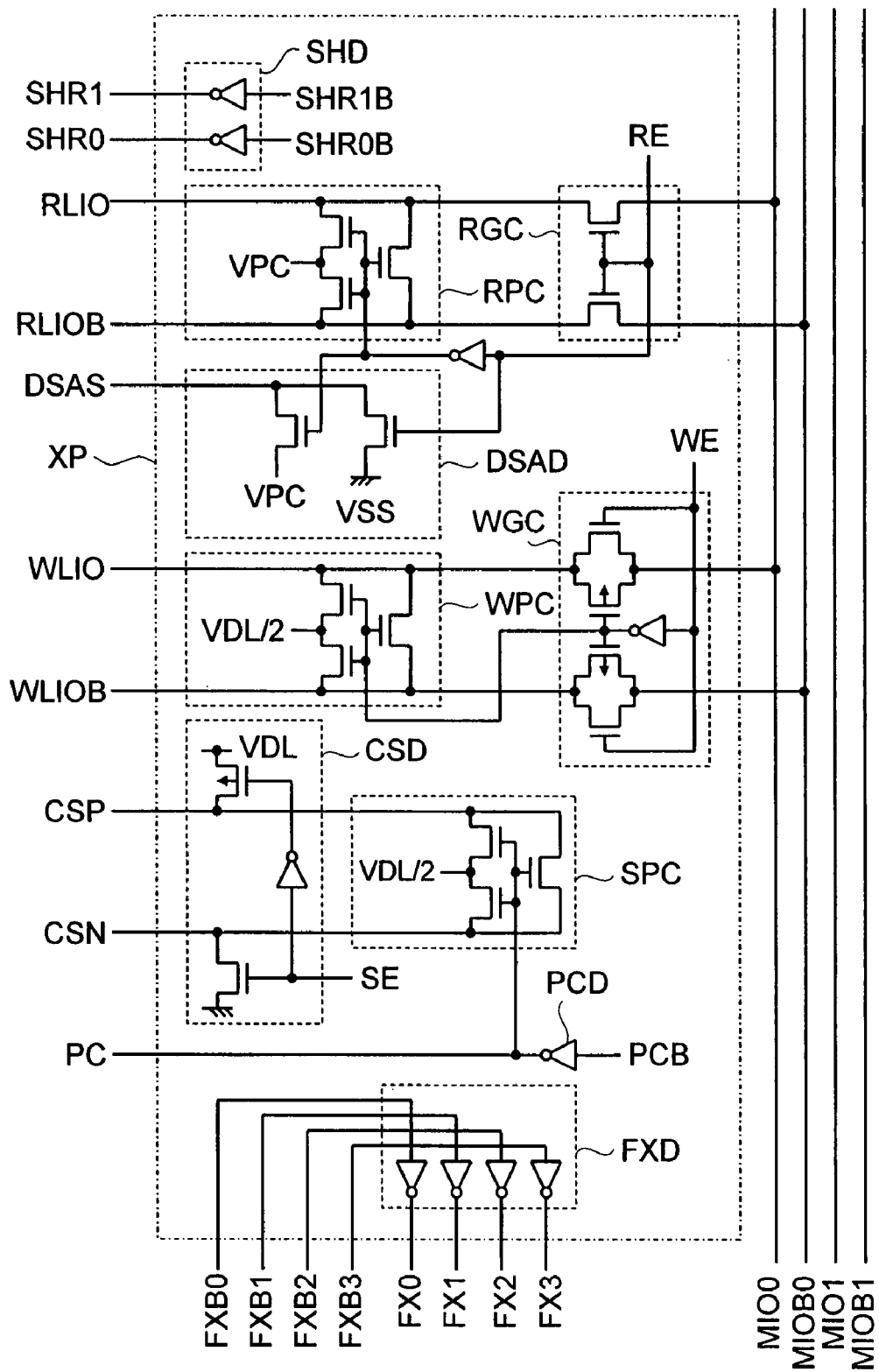
FIG. 5 is a circuit diagram of a cross area.

FIG. 5 is a circuit diagram of the cross area XP. The cross area includes an SHR-signal driver SHD, an RLIO-line pre-charge circuit RPC, a read gate RGC, a DSAS-line driver DSAD, a WLIO-line pre-charge circuit WPC, a write gate WGC, a CS-line driver CSD, a CS-line pre-charge circuit SPC, a PC-signal driver PCD, and an FX-line driver FXD. The SHR-signal driver, in which a complementary signal SHRB of the sense amplifier separation signal SHRB is inputted, outputs the SHR. The RLIO-line pre-charge circuit pre-charges the RLIO line to the VPC when a read enable signal RE is inactive at a VSS level. The read gate is a circuit for connecting the RLIO line and the main 10 lines MIO/MIOB when RE is at an activated VCL (used as a peripheral-circuit power-supply voltage at a level equal to the external VCC level or a level obtained by lowering it). At this time, in the case of setting the VPC to the VCL/2, a large on-state current of NMOS can be obtained even when only the NMOS is used to form the read gate. Therefore, a load of MIO can be made smaller than the case of the CMOS structure, and the signal on the MIO line can be increased. Also, even when the VPC is set to the VCL/2, there is no harm in reducing a threshold voltage of the NMOS used for the direct sense amplifier. The DSAS-line driver is a circuit for pre-charging the DSAS to the VPC when the RE is inactive and for driving the DSAS at the VSS when the RE is activated. As such, by disposing the DSAS-line driver on the cross area, the DSAS line can be activated in units of mats. Therefore, the direct sense amplifier can be activated only at the selected mat, whereby power consumption can be reduced. Also, in FIG. 2, in comparison to the case where the DSAS line drivers are disposed so as to be concentrated in a portion of the array control circuit ACC, a potential difference between far and near ends on the DSAS line becomes small due to an effect of dispersion and disposition of the drivers, so that there is an advantage such that variations in sense speeds depending on the location of the direct sense amplifier can be reduced.

The WLIO-line pre-charge circuit pre-charges the WLIO line to the VDL/2 when a write-enable signal WE is set at the inactive VSS level. The write gate is a circuit for connecting the WLIO line and the main IO lines MIO/MIOB when the WE is set at the active VCL level. In the case where the present circuit has a CMOS configuration, when write is performed from the MIO line to the WLIO line, the VCL level and the VSS level can be outputted without reduction in amplitude. The CS-line driver is a circuit for driving a P-side common source line CSP at the VDL (H level of the bit line) and an N-side common source line CSN at the VSS when a sense-amplifier enable signal SE is active. The CS-line pre-charge circuit SPC is a circuit for pre-charging the CSP and CSN at the VDL/2 when a pre-charge signal PC is activated. The PC-signal driver, into which a complementary signal PCB of the pre-charge signal PC is inputted, outputs the PC. The FX-line driver, into which a complementary signal FXB of the FX line is inputted, outputs the FX.

Figure 6:
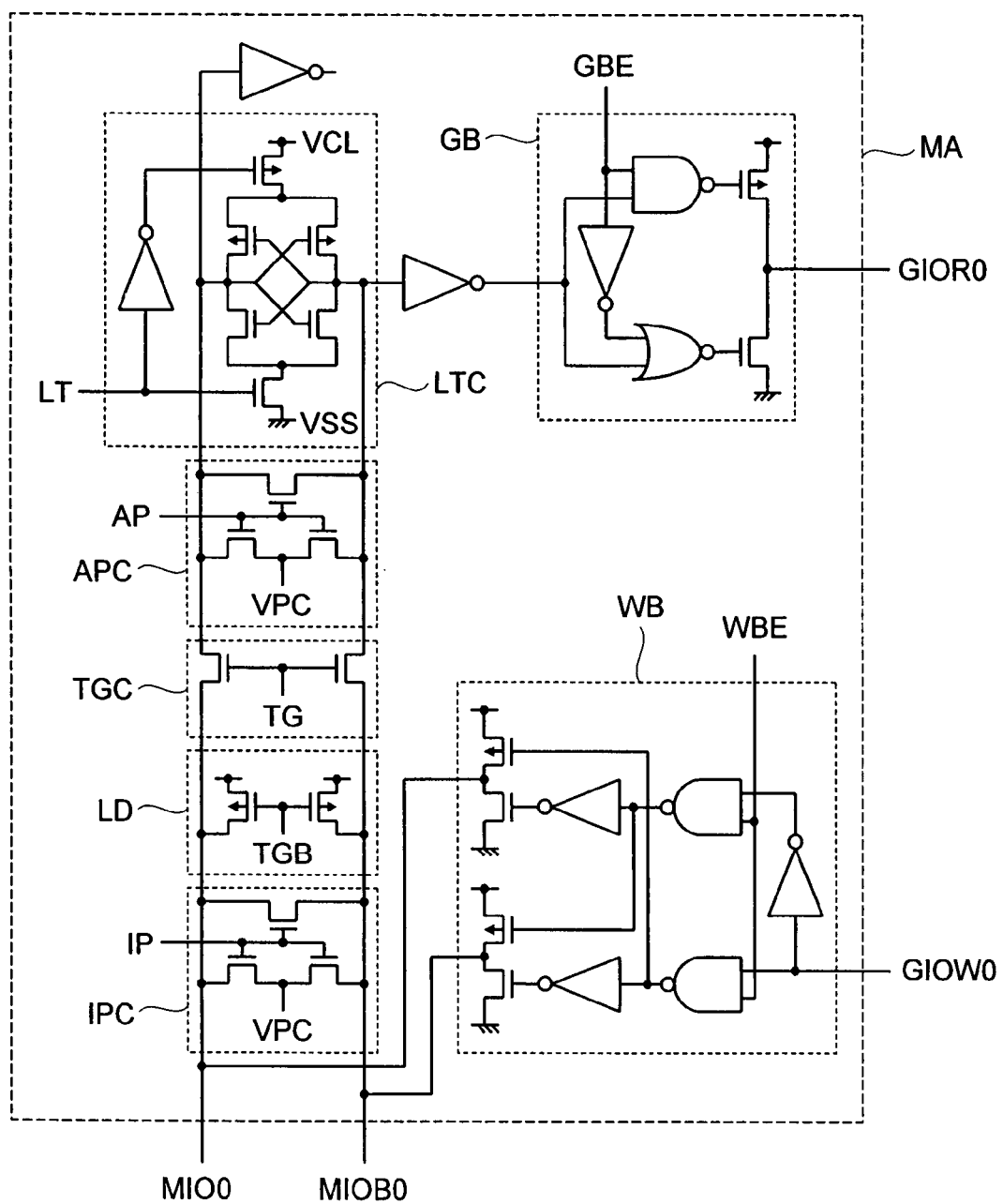
FIG. 6 is a circuit diagram of a main amplifier.

FIG. 6 shows a main amplifier circuit MA. The main amplifier circuit includes a MIO pre-charge circuit IPC, a load circuit LD, a transfer gate TGC, an MA pre-charge circuit APC, a latch circuit LTC, a GIO buffer GB, and a write buffer WB. The MIO pre-charge circuit pre-charges an MIO line at the VPC when an MIO pre-charge signal IP is activated. The load circuit functions as a load on the MIO line when a transfer gate control signal TG is activated and its complementary signal TGB is set at the VSS. The transfer gate is conducted when the TG is activated, thereby connecting the MIO and the latch circuit. The main amplifier pre-charge circuit APC pre-charges the inside of the main amplifier to the VPC when the main amplifier pre-charge signal AP is activated. The latch circuit is a circuit for amplifying, to a full amplitude (VCL, i.e., the power-supply potential or VSS), a signal having a small amplitude inputted from the MIO and for retaining the full amplitude. The GIO buffer is a circuit for outputs data retained in the latch circuit to a read global IO line GIOR when a GIO buffer enable signal GBE is activated. The write buffer WB is a circuit for outputting data on a write global IO line GIOW to the MIO/MIOB when a write buffer enable signal WBE is activated.

Figure 7:
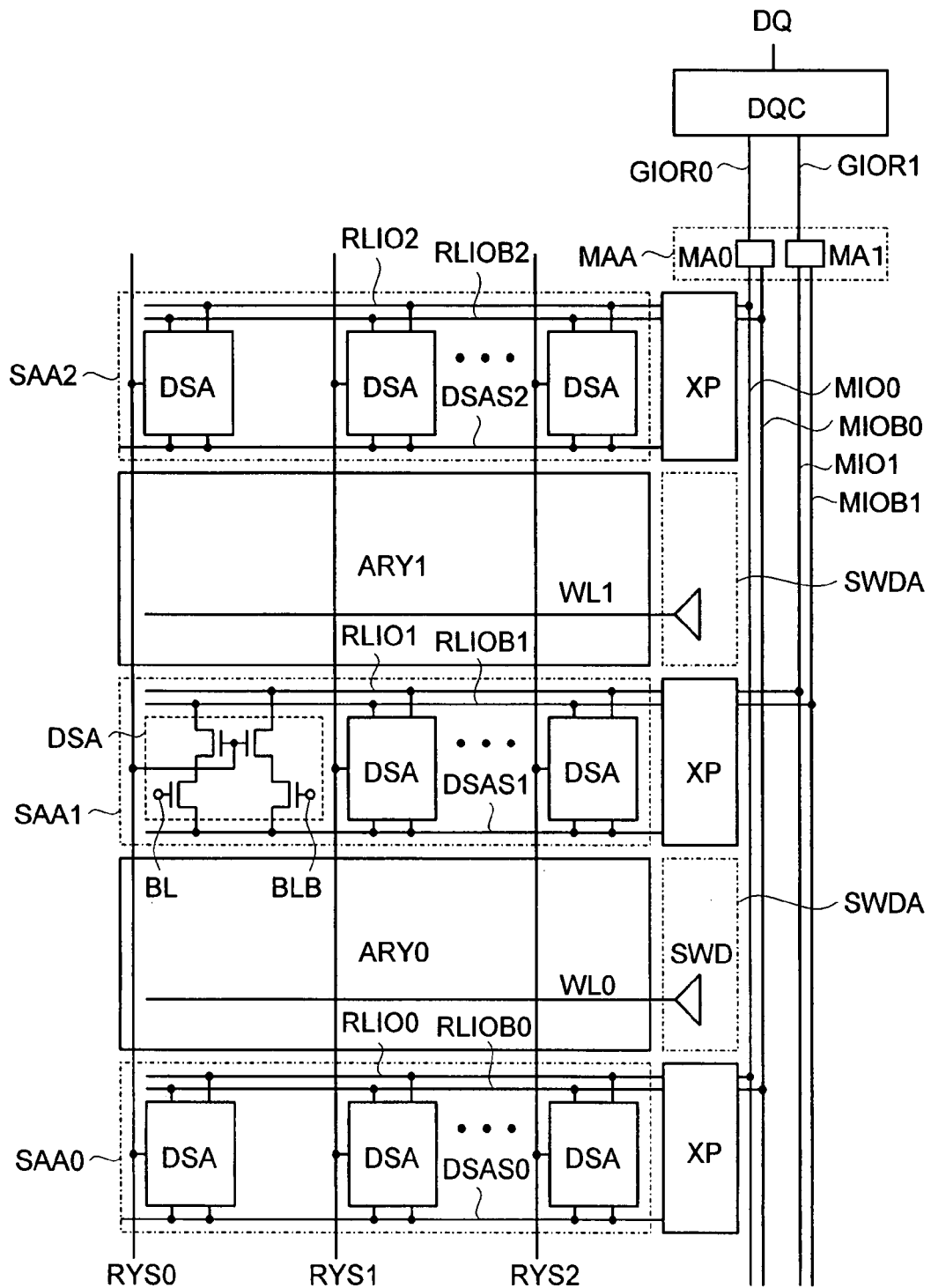
FIG. 7 is a block diagram of a data path during reading.

To illustrate a read operation, FIG. 7 shows a block diagram of two memory arrays ARY0, ARY1 and three sense amplifier columns SAA0 to SAA2, which are part of FIG. 1. In this drawing, the read column select lines RYS in every sense amplifier column are connected to one direct sense amplifier DSA, but may be connected to a plurality of direct sense amplifiers. In this case, it is accordingly required to increase the number of read LIO pairs. Also, two pairs of MIO0/MIOB0 and MIO1/MIOB1 are alternately connected to the read gate circuit in the cross area. Therefore, when the word line WL0 and the RYS0 are activated, pieces of data are read to the sense amplifier columns SAA0 and SAA1 and these pieces of data are read via the RLIO0/RLIOB0 and RLIO1/RLIOB1 to the MIO0/MIOB0 and MIO1/MIOB1, respectively.

Figure 8:
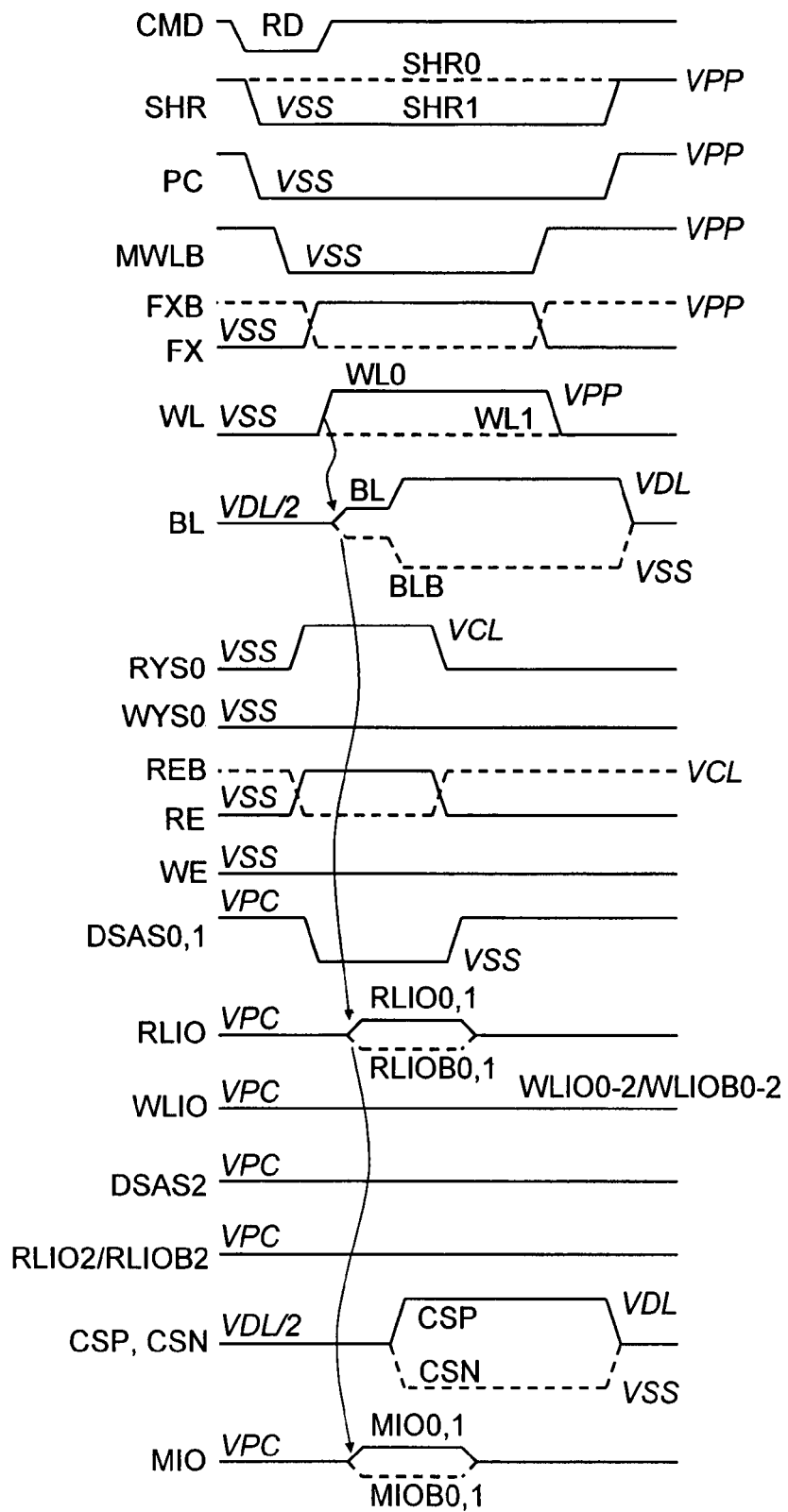
FIG. 8 shows operation waveforms during the reading.

A read operation will be described by using operation waveforms in FIG. 8. When a read command RD is inputted from the outside of the chip, the sense amplifier separation signal SHR and the pre-charge signal PC are deactivated in the sense amplifier columns SAA0 and SAA1 specified by addresses. Furthermore, the read enable signal RE is activated, and the direct-sense-amplifier common source lines DSAS0 and DSAS1 are driven at the VSS. Here, when the RYS0 is activated by the column decoder, the direct sense amplifiers start operating in the sense amplifier columns SAA0 and SAA1. At this time, in the unselected sense amplifier column SAA2, since the RLIO2/RLIOB2 have the same potentials as that of the DSAS2, a penetrating current does not flow therebetween. Similarly, also in the other unselected sense amplifiers, since a penetrating current does not flow therebetween, current consumption can be reduced. Note that the same potential in this case is that a potential difference between the RLIO2/RLIOB2 and the DSAS2 is at a level at which the direct sense amplifier connected to their lines does not start operating. The current consumption can also be reduced, by setting both of the RIO2/RIO2B and the DSAS to have a voltage equal to or more than a value obtained by subtracting a threshold voltage of the NMOS used for the DSAS from the bit line potential VDL/2. As evident from the block diagram of FIG. 1, since the RYS is connected to a number of sense amplifier columns, this circuit scheme is effective in reducing an operation current. Also, it is possible to prevent a penetrating current, by setting an absolute value of a potential difference between the RLIO/RIOB and the common source line DSAS connected to the selected sense amplifier column to be larger than an absolute value of a potential difference between the RLIO/RIOB and the common source line DSAS connected to the unselected sense amplifier column. In this way, a similar effect can be obtained, by setting a current flowing between the source and drain of the transistor connecting the unselected sense amplifier and the bit line to be less than a current flowing between the source and drain of the transistor connecting the selected sense amplifier and the bit line.

When the main word line MWLB is decreased to the VSS in the row decoder and the FX is activated in the array control circuit ACC, the selected word line WL0 is activated to the VPP. In the memory cell selected by the word line WL, a cell transistor is conducted and a signal is read to the bit line BL. Here, since the memory cell has a twin-cell architecture, one of the BL/BLB is higher than a pre-charge level of the bit line and the other is lower than that. Upon reception of the signal on the bit line, the direct sense amplifier drives the RLIO/RLIOB, whereby a voltage difference occurs on the RLIO/RLIOB. Since the read gate becomes conducted in the cross area by the RE, this signal is transmitted to the MIO/MIOB. Also, in the present embodiment, after the RYS0 is activated and the DSAS0 and DSAS1 are driven at the VSS, the word line WL is activated the RYS0. However, the WL can be started before the RYS0 and DSAS0 and DSAS1 are driven. By doing so, operation margin can be reduced more than that of the normal sense amplifier.

Figure 9:
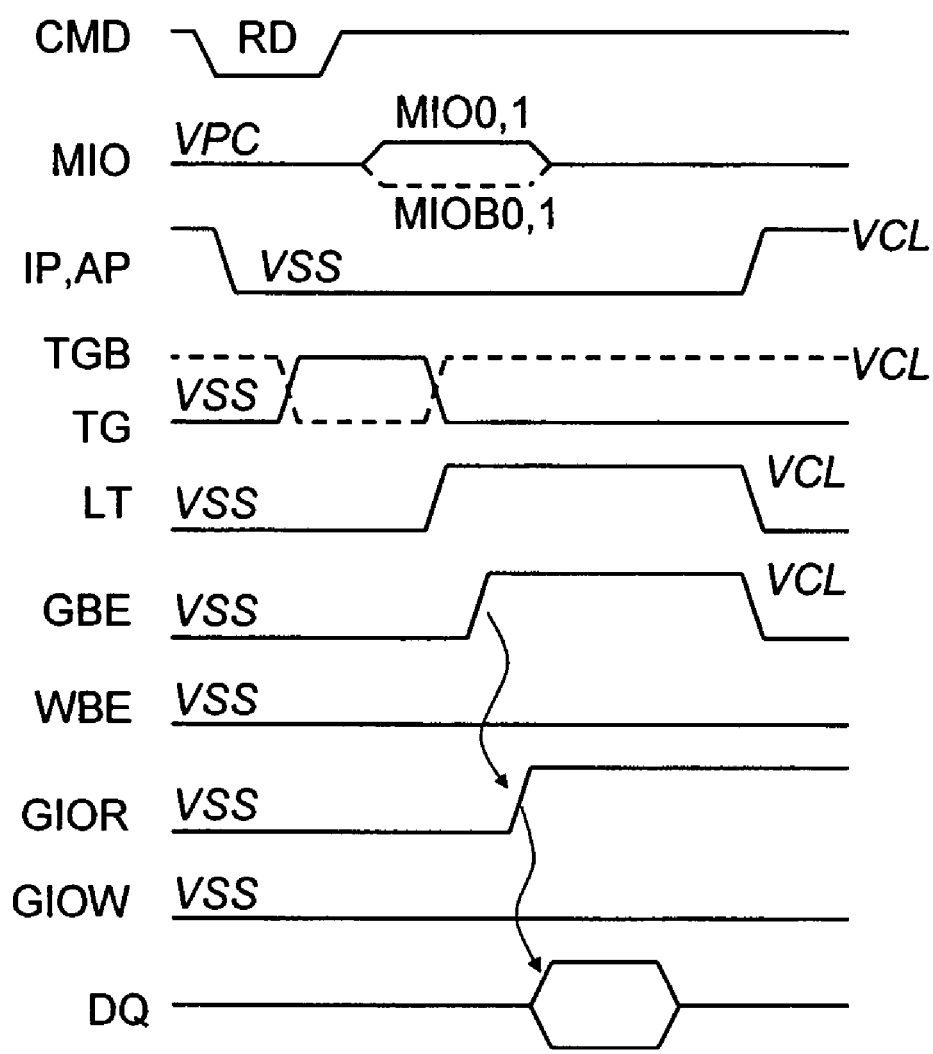
FIG. 9 shows the operation waveforms to be continued during the reading.

The operation following thereafter will be described with reference to FIG. 9. Almost at the same time when the RE is activated, the transfer gate control signal TG is activated. Therefore, a signal on the MIO is inputted to the latch in the main amplifier. At timing when the signal becomes sufficiently large at an input end of the latch, the TG is deactivated and the latch signal is activated and then the data is fixed and retained. Thereafter, the GIO buffer enable signal GBE is activated, data is forwarded to the output circuit DQC via the read global IO line GIOR, and the data is outputted to a DQ. When a fix of the data by the latch is completed, the pre-charging is started at the RLIO line pairs, the MIO line pairs, and the DSAS line used for reading.

At the same time of reading the data subsequently to the direct sense amplifier, a re-write operation is performed in the memory array. As shown in FIG. 8, when the P-side common source line CSP is driven at the VDL and the N-side common source line CSN is driven at the VSS, the restore amplifier CC in the sense amplifier amplifies the bit line to the VDL or VSS. The word line is deactivated to the VSS at the timing when the data is sufficiently written in the memory cell. In the sense amplifier column, the PC and SHR are activated and the bit line and the common source line are pre-charged, whereby a read cycle ends. Therefore, by using the direct sense amplifier, the data reading and a re-write operation of the memory array can be performed in parallel. Therefore, while the direct sense amplifier is stared earlier than the case where the word line is activated and thereby the reading of the data is speeded up, the restore amplifier is started after the word line is activated and the signal from the memory cell sufficiently occurs on the bit line, so that a highly reliable re-write operation can be performed.

Figure 10:
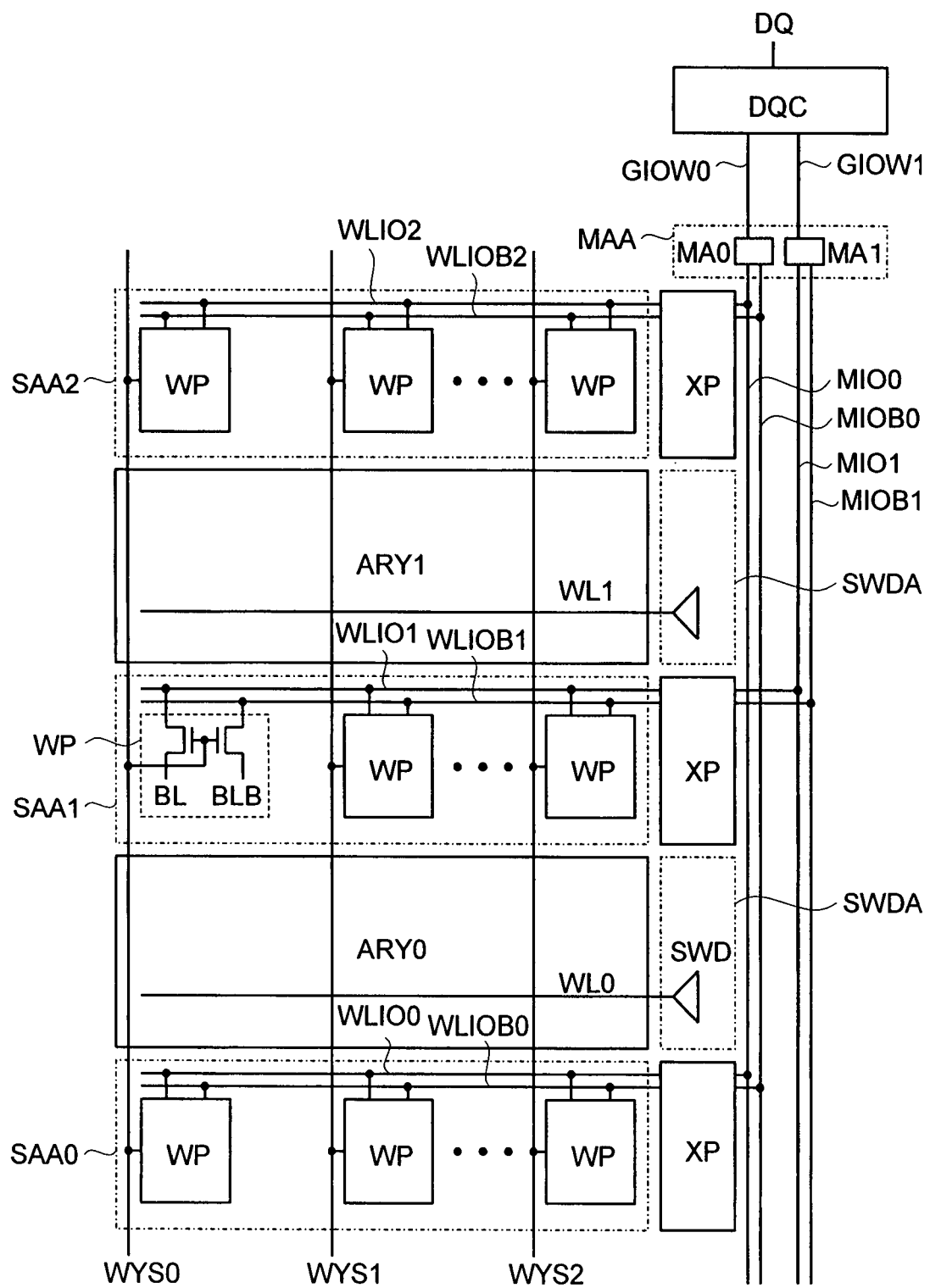
FIG. 10 is a block diagram of a data path during writing.

To illustrate a write operation, FIG. 10 shows a block diagram of two memory arrays ARY0 and ARY1 and three sense amplifier columns SAA0 to SAA2, which are part of FIG. 1. In this Figure, the write column select lines WYS in every sense amplifier column are connected to one write circuit WP, but may be connected to a plurality of write circuits. In this case, it is accordingly required to increase the number of write LIO pairs. Also, two pairs of MIQ0/MIOB0 and MIO1/MIOB1 are alternately connected to the write gate circuit in a cross area. Therefore, when the word line WL0 and the WYS0 are activated, pieces of data on the MIO0/MIOB0 and MIO1/MIOB1 are written from the write circuits in the sense amplifier columns SAA0 and SAA1 via the WLIO0/WLIOB0 and WLIO1/WLIOB1 to the data line and the memory cell of the memory array, respectively.

Figure 11:
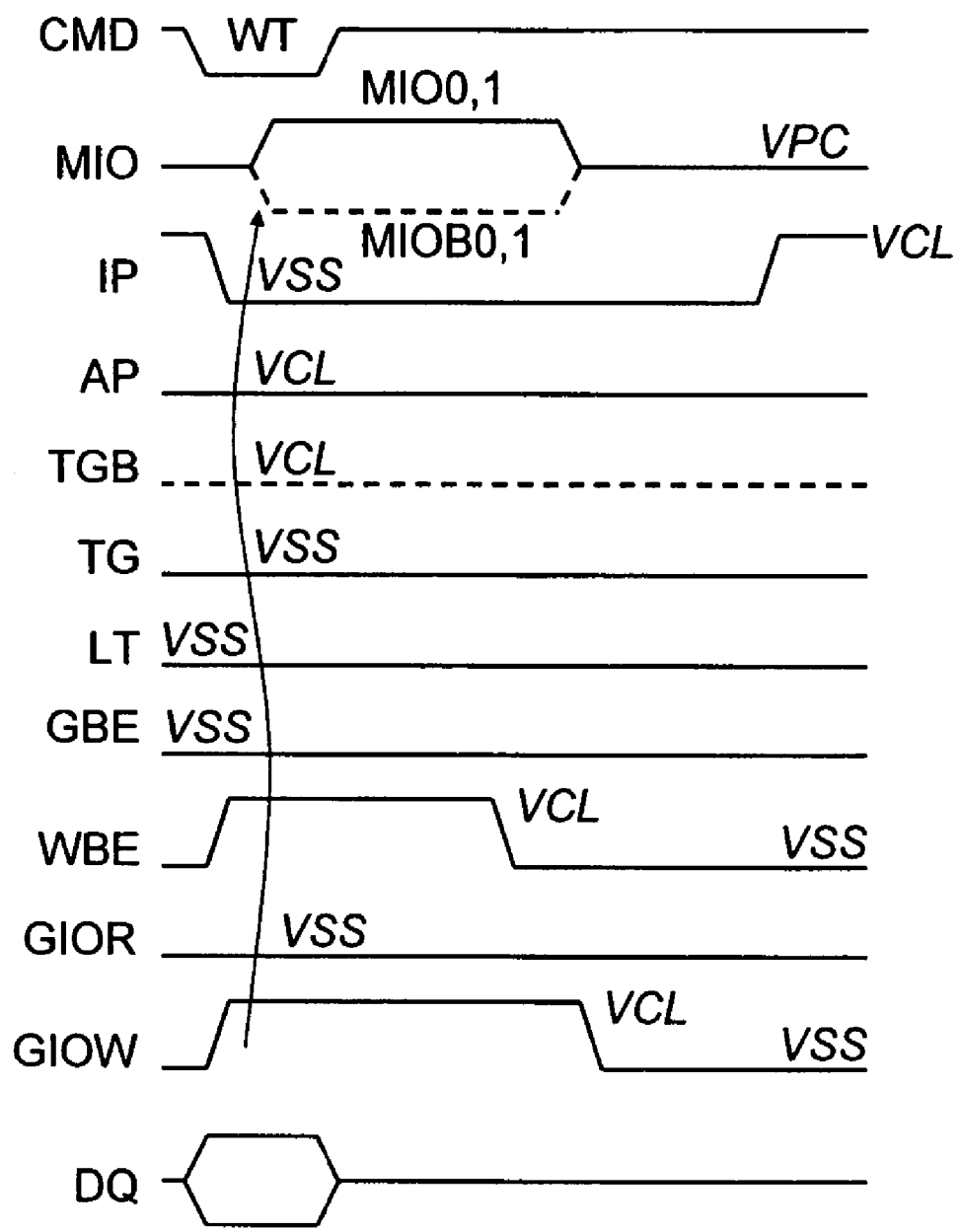
FIG. 11 shows operation waveforms during the writing.

A write operation will be described by using operation waveforms in FIG. 11. When a write command WT is inputted from the outside of the chip, write data is captured from the DQ and is then outputted to the write global IO line GIOW. When the MIO pre-charge signal IP is deactivated and the write buffer enable WBE is activated, write data is outputted to the MIO line.

Figure 12:
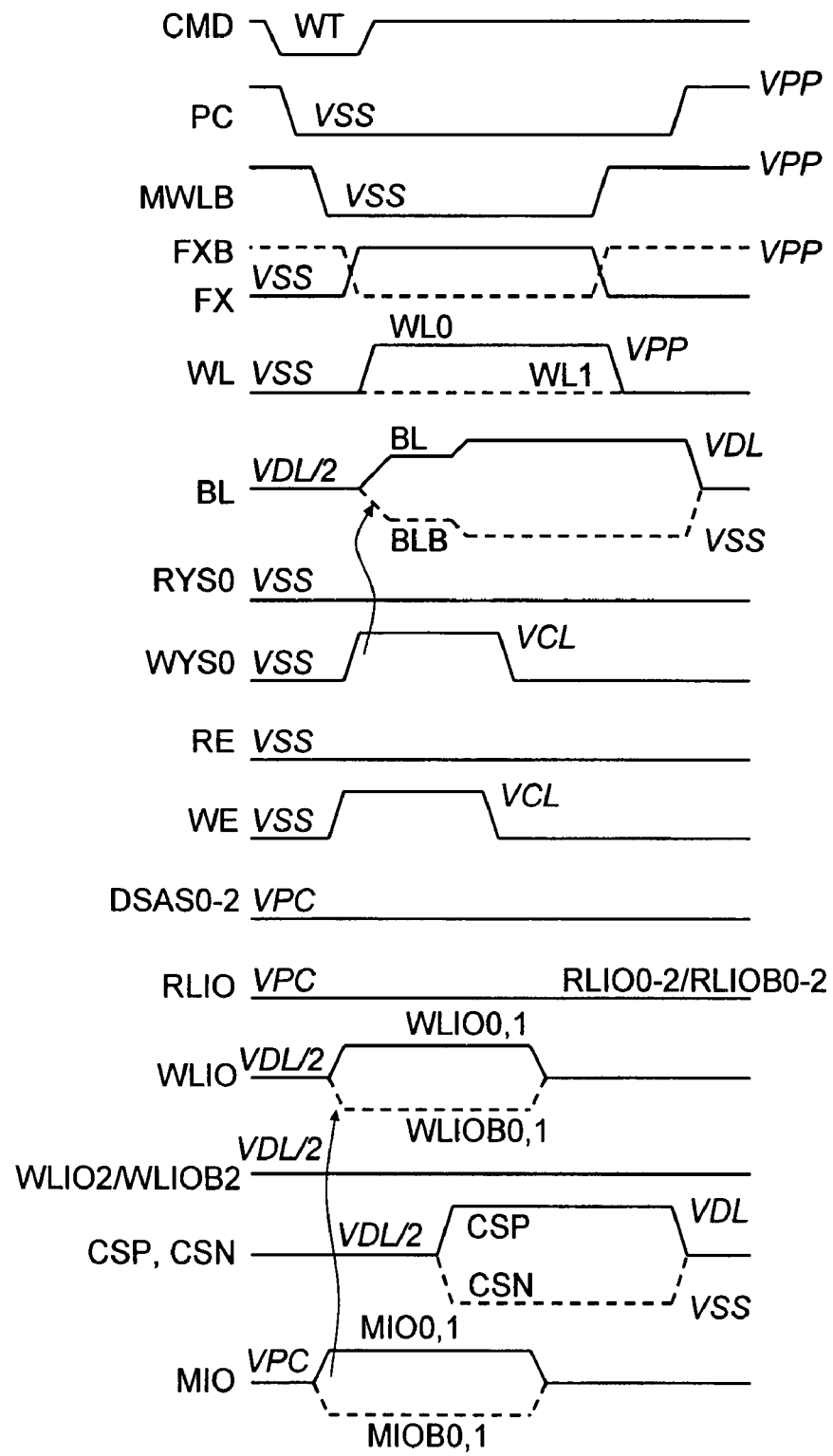
FIG. 12 shows the operation waveforms to be continued during the writing.

An array operation following thereafter will be described with reference to FIG. 12. When the write command WT is inputted from the outside of the chip, the sense-amplifier separation signal SHR and the pre-charge signal PC are deactivated in the sense amplifier columns SAA0 and SAA1 specified by addresses. Furthermore, the write enable signal WE is activated and the write gate is conducted in the cross area, whereby the write data is written from the MIO/MIOB to the WLIO/WLIOB. When the WYS0 is activated by the column decoder, writing to the bit line of the memory array is started. At this time, in the unselected sense amplifier column SAA2, the WLIO2/WLIOB2 remain at the VDL/2. Therefore, even if these are connected to the bit line, they have the same potential as that of the bit line and thus no current flows. The same occurs even in the other unselected sense amplifier columns. As evident from the block diagram of FIG. 1, since the WYS is connected to a number of sense amplifier columns, this circuit scheme is effective in reducing an operation current.

When the main word line MWLB is decreased to the VSS in the row decoder and the FX is activated in the array control circuit ACC, the selected word line WL0 is activated to the VPP. In the memory cell selected by the word line WL, a cell transistor is conducted, and data is written from the bit line to the memory cell. Furthermore, when the P-side common source line CSP is driven at the VDL and the N-side common source line CSN is driven at the VSS, the restore amplifier CC in the sense amplifier amplifies the bit line to the VDL or VSS. Upon completion of the data writing to the memory array, the WE is deactivated, the WLIO and MIO are cut off, and the WLIO and MIO are pre-charged. The word line is deactivated to the VSS at the timing when data is sufficiently written in the memory cell. In the sense amplifier column, the PC and SHR are activated, and the bit line and the common source line are pre-charged, whereby a write cycle ends.

Figure 13:
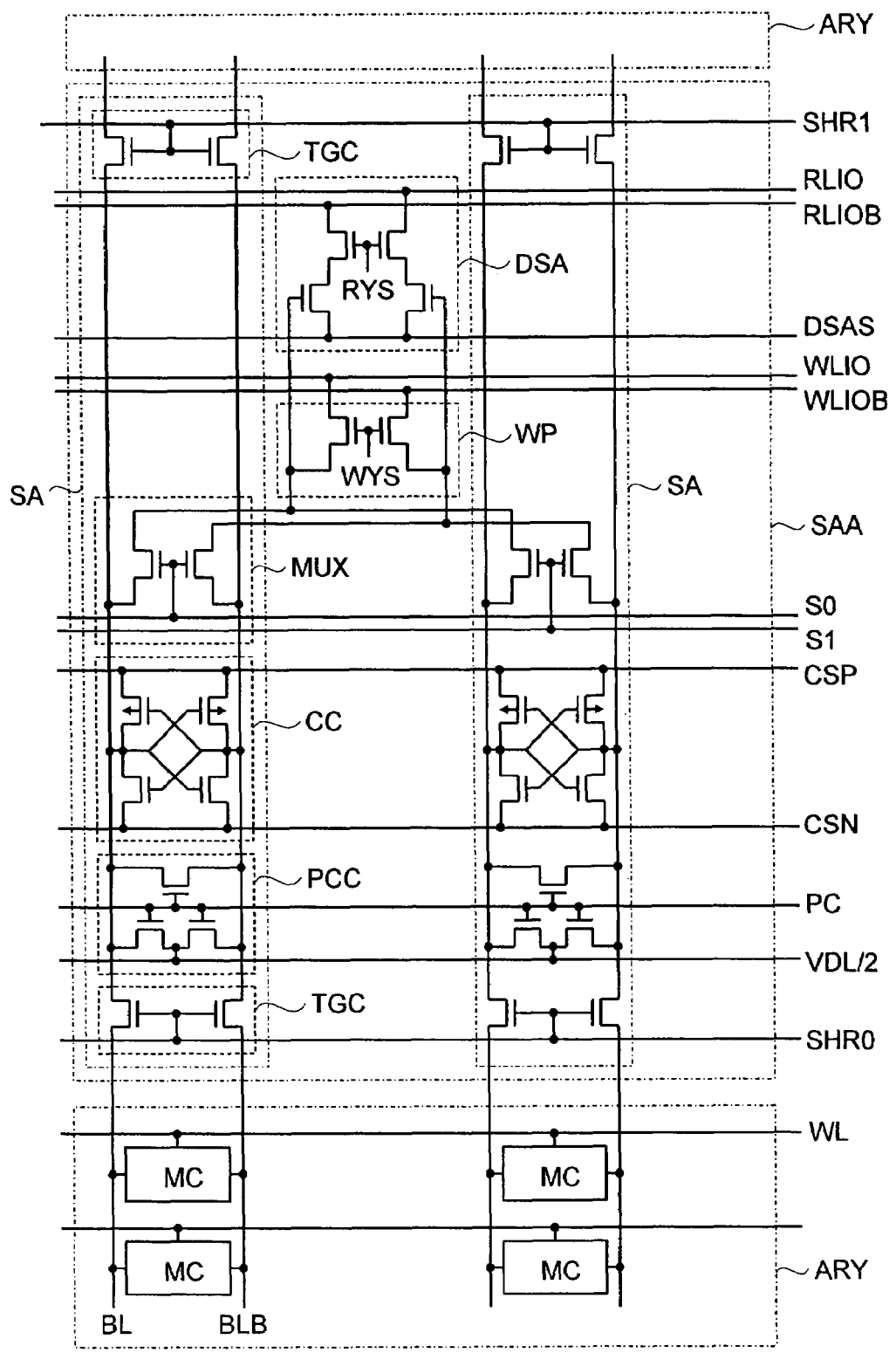
FIG. 13 is a circuit diagram of a second sense amplifier.

FIG. 13 shows a circuit of a second sense amplifier SA. In this sense amplifier, two SAs share a set of the direct sense amplifier DSA and the write circuit WP. For this reason, by adding selecting means such as a multiplexer MUX and selecting either one of the S0 and S1, it is selected which of the two SAs is connected to the RLIO/RLIOB or WLIO/WLIOB. Respective circuits and operations of the transfer gate TGC, the pre-charge circuit PCC, the restore amplifier CC, the write circuit WP, and the direct sense amplifier DSA are the same as those shown in FIG. 1. In this sense amplifier, in addition to having the same effects as those of the sense amplifier of FIG. 1, since the direct sense amplifier DSA can be disposed in a region for the two sense amplifiers, it is possible to increase the size of the MOS transistor in the direct sense amplifier DSA and increase the signal amounts read in the RLIO/RLIOB and the MIO/MIOB. Thus, since the load capacitance of the bit line is increased by adding the multiplexer into the sense amplifier, the signal amount of bit line is reduced. However, as shown in the Figure, since the twin cell is used in the present invention, the signal amount of bit line is approximately twice as much as the case where one normal DRAM cell is used. Therefore, there is an advantage in which an influence of reduction in the signal amount of bit line becomes small due to the addition of the multiplexer.

Figure 14:
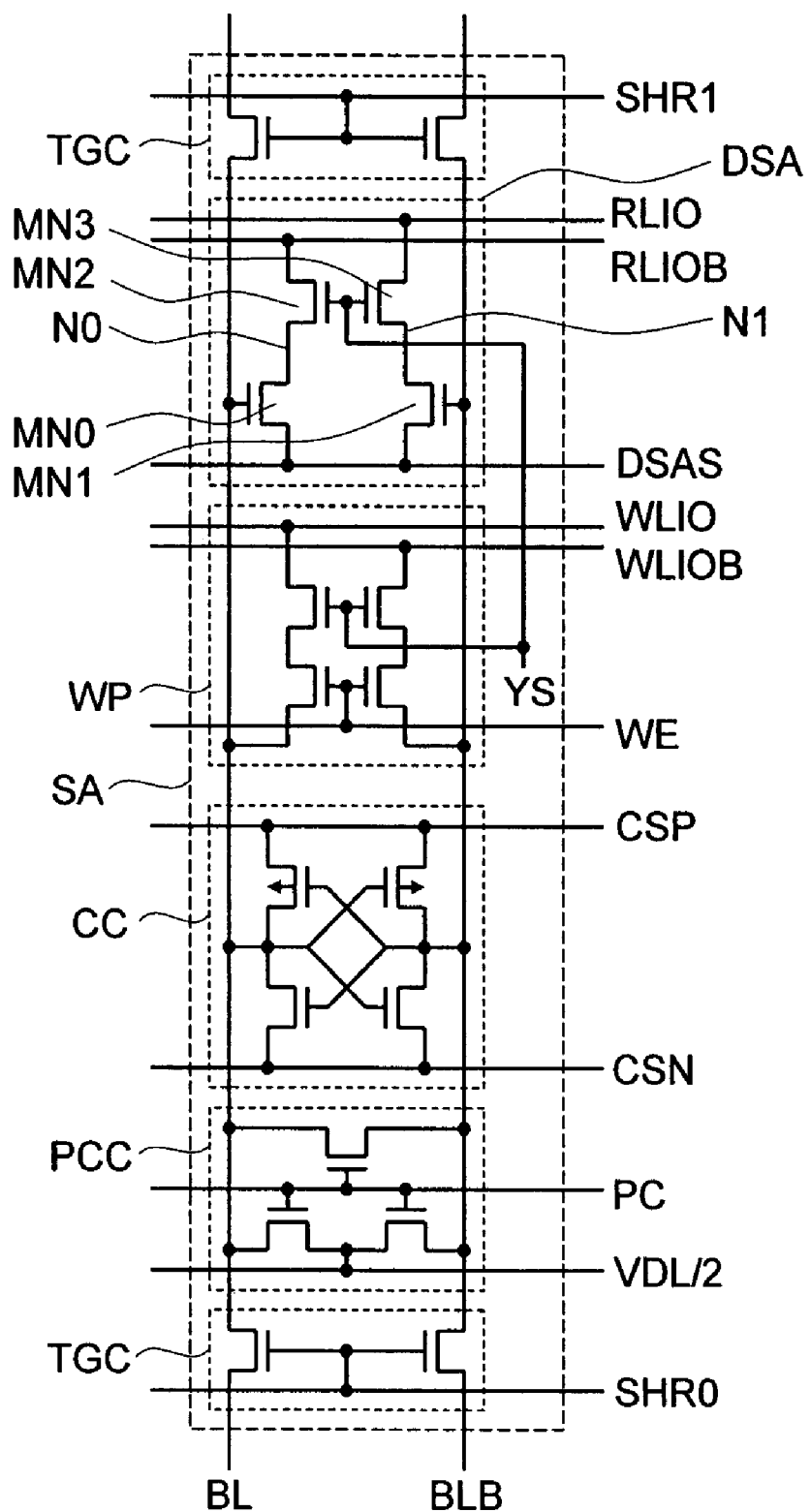
FIG. 14 is a circuit diagram of a third sense amplifier.

FIG. 14 shows a circuit of a third sense amplifier SA. In this sense amplifier, the select line YS is common to reading and writing. For this reason, in the write circuit WP, the MOS transistor controlled by the write enable signal WE is connected in series to the MOS transistor controlled by the column select line. Since the WE is deactivated during the reading, the sense amplifier and the WLIO/WLIOB are not connected even if the column select line YS is activated. The circuits and operations of the transfer gate TGC, the pre-charge circuit PCC, the restore amplifier CC, and the direct sense amplifier DSA are the same as those shown in FIG. 1. In this sense amplifier, in addition to having the same effects as those of the sense amplifier of FIG. 1, the number of column select lines is reduced by half in comparison with the sense amplifier of FIG. 1. Therefore, a process can be facilitated by expanding the wiring pitch, and the operation of the sense amplifier can be speeded up by increasing the number of power-supply wirings.

Figure 15:
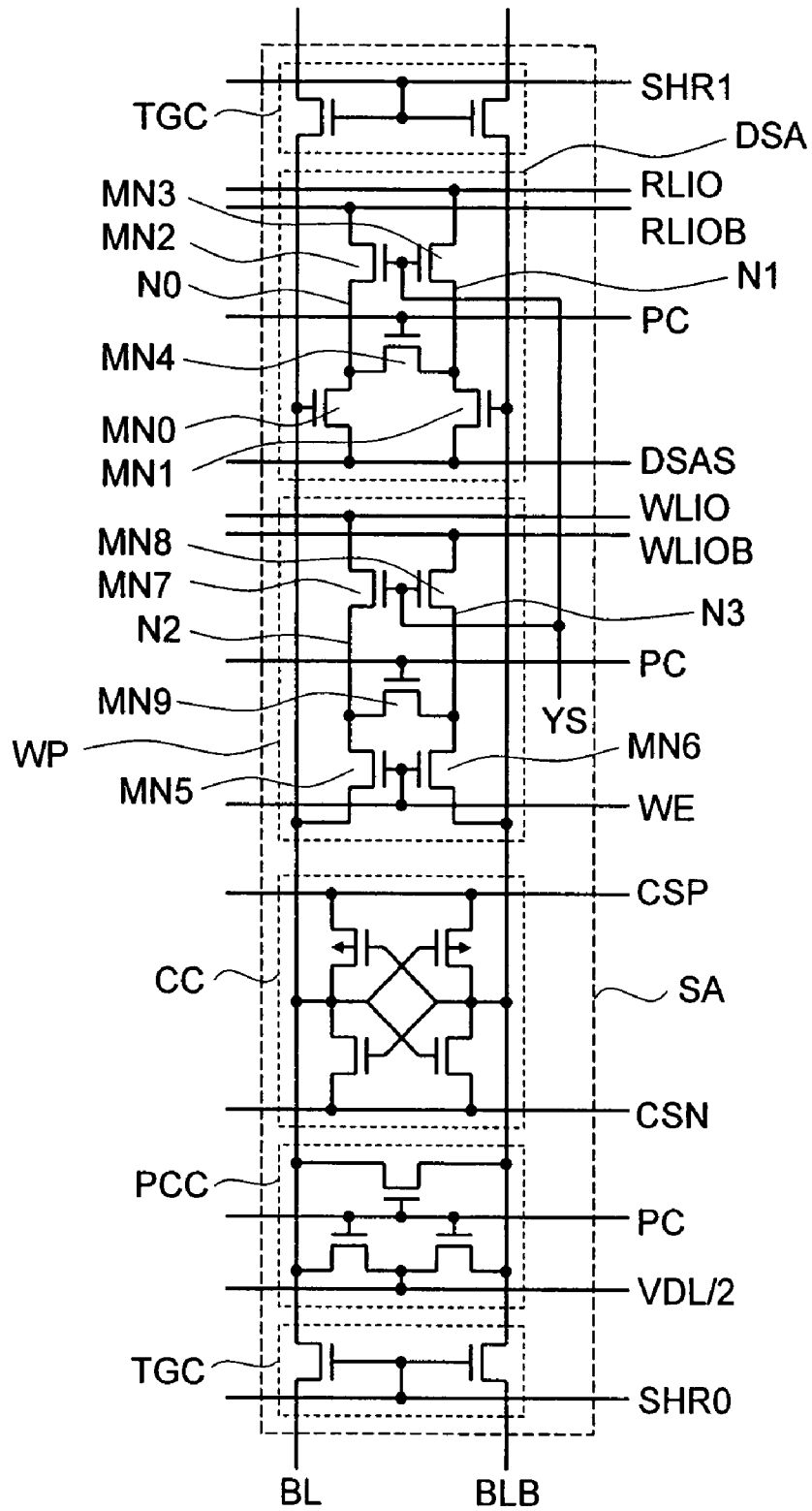
FIG. 15 is a circuit diagram of a fourth sense amplifier.
Figure 16:
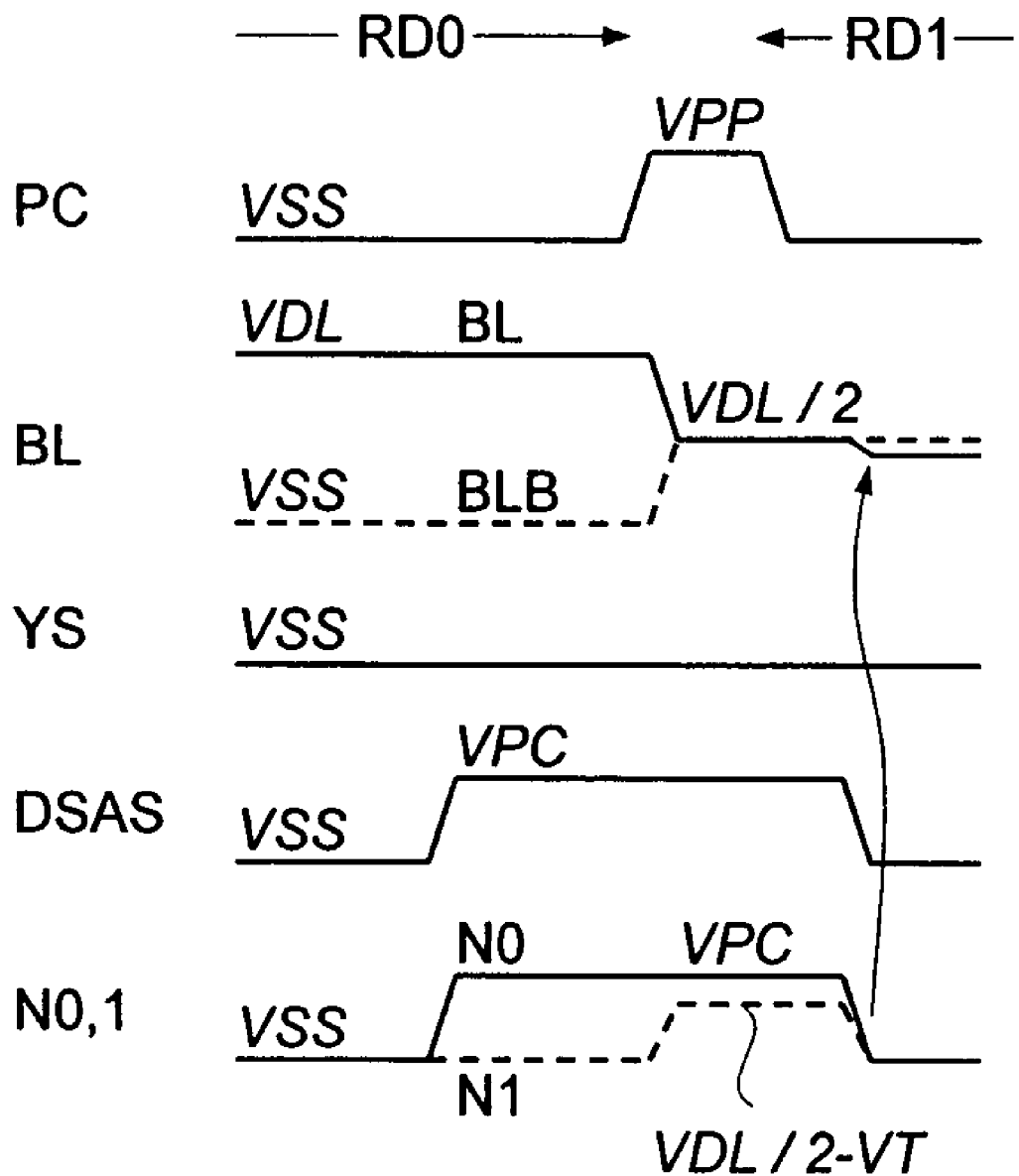
FIG. 16 shows operation waveforms of the third sense amplifier.

FIG. 15 shows a circuit of a fourth sense amplifier SA. In this sense amplifier, an equalizing MOS transistor MN4 is connected between connection points N0 and N1, which connects the MOS transistors MN2 and MN3 controlled by the column select line YS in the direct sense amplifier DSA and the MOS transistors MN0 and MN1 each having a gate connected to the bit line, respectively, in the sense amplifier of FIG. 14. When the pre-charge signal PC is activated, this MOS transistor is conducted, thereby short-circuiting them between the points N0 and N1. Operation waveforms of the sense amplifier of FIG. 14, which has no MN4, are shown in FIG. 16. As for the sense amplifier in which the YS is unselected during a read operation, when the DSAS is driven at the VSS, the points N0 and N1 each have a potential of VSS. If the DSAS is recovered to the VPC with the bit lines BL and BLB being amplified to the VDL and VSS, respectively, the point N0 becomes at the VPC and the point N1 remains at the VSS since the MN0 is in an ON state and the MN1 is an OFF state. If the bit line is pre-charged, the point N0 remains at the VPC. However, since the gate of the MN0 is at the VDL/2, the point N1 is increased only up to "VDL/2−VT". In this case, "VT" is a threshold voltage of the MN1. Therefore, with the bit line being pre-charged, a potential difference occurs between the points N0 and N1. When the DSAS is driven at the VSS in the next read cycle, the potentials of the points N0 and N1 are again decreased to the VSS. At this time, however, since a coupling voltage returned to the bit lines via the MN0 and MN1 becomes unbalanced between the BL and BLB, this causes noise to the sense amplifier. In the sense amplifier of FIG. 15, to which the equalizing MOS transistor MN4 is added, since a potential difference between the points N0 and N1 during the pre-charging can be eliminated, it is possible to reduce the noise during the operation and achieve the stable circuit operation.

Also, in the write circuit WP of the sense amplifier of FIG. 15, an equalizing MOS transistor MN9 is connected between connection points N2 and N3, which connect MOS transistors MN7 and MN8 controlled by the column select line YS and MOS transistors MN5 and MN6 controlled by the write enable signal WE, respectively. This MOS transistor is conducted when the pre-charge signal PC is activated, thereby short-circuiting them between the points N2 and N3. In the case of the sense amplifier of FIG. 14, which has no MN9, if the WE is returned to the VSS with the bit lines BL and BLB being amplified to the VDL and VSS during the write operation, the points N2 and N3 remain at the VDL and VSS, respectively. The electric charges stored in these nodes are retained during the pre-charging, so that they flow to the BL and BLB when the WE is activated in the next write cycle. Therefore, by adding the equalizing MOS transistor MN9 thereto, it is possible to reduce the noise during the operation and achieve the stable circuit operation. Here, in the case of the sense amplifier of FIG. 14, if the WE is activated during the pre-charging and is deactivated only during the read operation, the MN9 may be not connected thereto. However, in this case, unless deactivation of the WE is made earlier than activation of the word line, the read signal from the memory cell on the bit line, in which the YS is selected, flows to the LIO via the MN5 to MN8. Accordingly, in the sense amplifier of FIG. 15, if the WE is deactivated during the pre-charging and is activated only during the write operation, a timing margin during the operation can be alleviated.

Note that FIG. 15 illustrates the case where the column select line connected to the direct sense amplifier DSA and the column select line connected to the write circuit WP are the same. However, the same effect can be achieved even if these are separated. Even in such a case, to perform a write mask operation in which write is stopped by any of the sense amplifiers selected by the WYS and DSAS during the writing operation, the MN5 and MN6 are required and providing the MN9 becomes effective in order to solve such problems described above.

Figure 17:
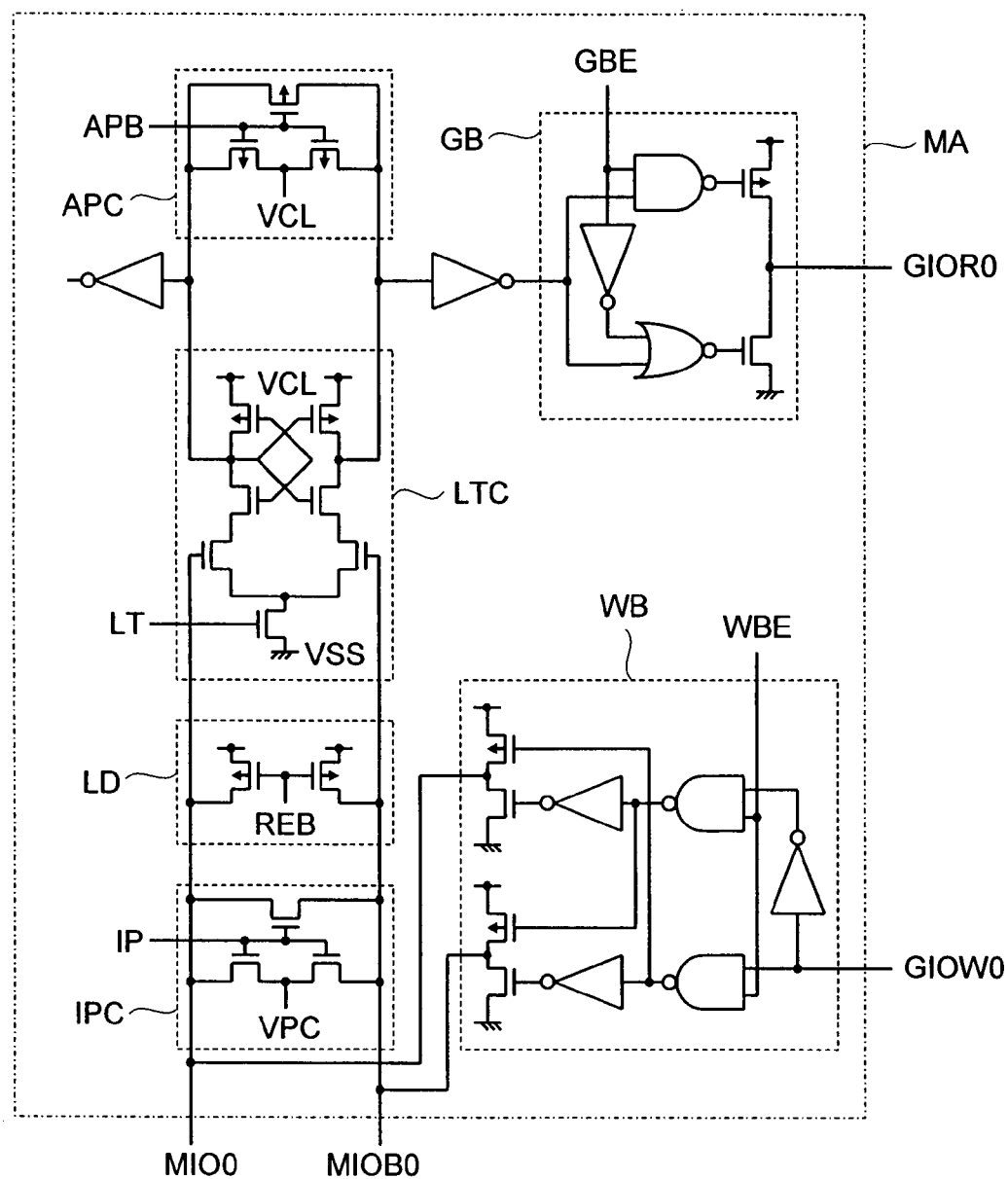
FIG. 17 is a circuit diagram of a second main amplifier.

FIG. 17 shows a second main amplifier circuit MA. This main amplifier includes an MIO pre-charge circuit IPC, a load circuit LD, an MA pre-charge circuit APC, a latch circuit LTC, a GIO buffer GB, and a write buffer WB. The MIO pre-charge circuit pre-charges the MIO line to the VPC when the MIO pre-charge signal IP is activated. The load circuit functions as a load on the MIO line when the read enable signal RE is activated and the REB is at the VSS. The main amplifier pre-charge circuit pre-charges an output node of the latch to a VCL (power-supply potential) when a complementary main amplifier pre-charge signal APB is at the VSS. The latch circuit is a circuit for amplifying, to a full amplitude (VCL or VSS), a signal having a small amplitude inputted from the MIO at a time of activation of the latch signal LT and for retaining it. The latch circuit of this main amplifier is different from the latch circuit of the main amplifier of FIG. 6 in that the gate-input amplifier and the cross couple are used. Therefore, since the input capacitance viewed from the MIO line is reduced, an input signal of the main amplifier can be increased, so that there is an advantage of having a high operation speed. Meanwhile, if the MIO level is too lowered, there is the problem that a conductance of the MOS transistor whose gate is inputted to the MIO is decreased and the operation speed becomes late. Therefore, in view of the operation margin, the first main amplifier of FIG. 6 is more advantageous. The structures of the GIO buffer and the write buffer WB are the same as those of the main amplifier of FIG. 6.

Figure 18:
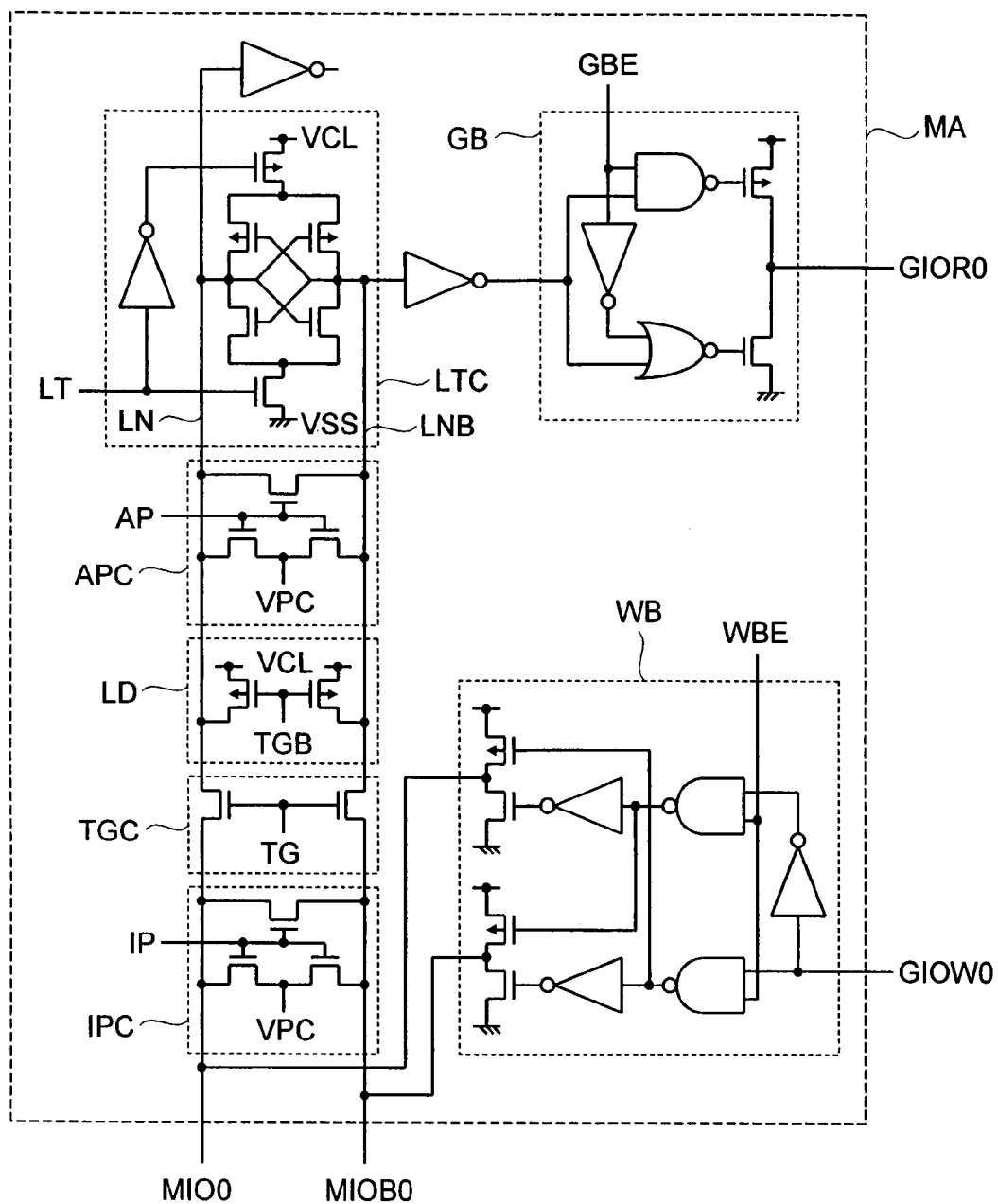
FIG. 18 is a circuit diagram of a third main amplifier.

FIG. 18 shows a third main amplifier circuit MA. In this main amplifier, the load circuit LD and the transfer gate TGC in the first main amplifier circuit of FIG. 6 are exchanged only in position, and the other circuits are much the same. Thus, since the load circuit is provided inside of the transfer gate of the N-type MOS transistor with respect to the main IO, these operate as a common gate amplifier. Therefore, a signal difference between the MIO0/MIOB0 is amplified and transmitted to inputs LN and LNB of the latch. Accordingly, the input signal of the latch circuit is increased, so that there are advantages of improving the operation speed of the latch and enhancing the operation margin.

Figure 19:
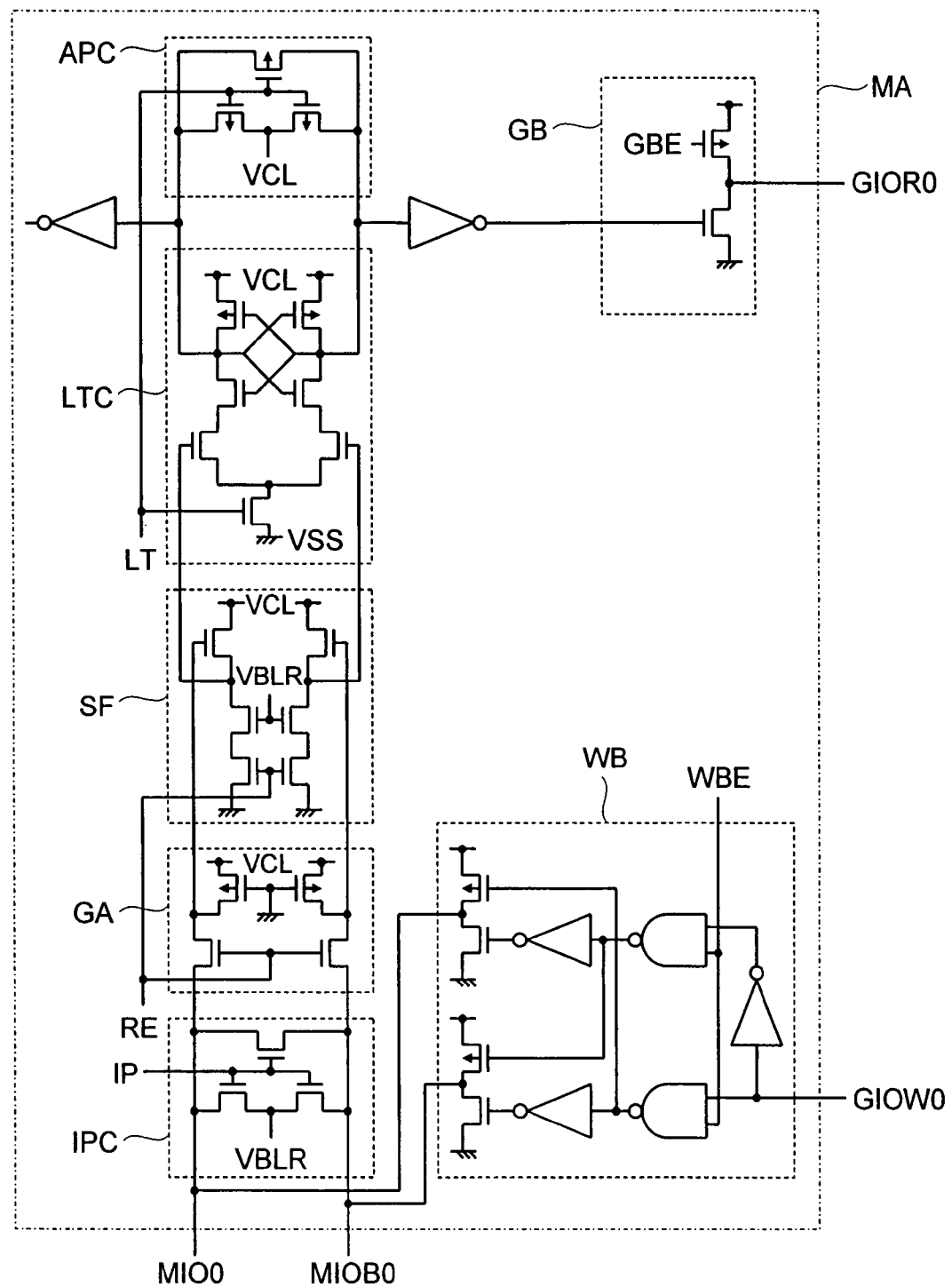
FIG. 19 is a circuit diagram of a fourth main amplifier.

FIG. 19 shows a fourth main amplifier circuit MA. In this main amplifier, the common gate amplifier GA in the third main amplifier of FIG. 18 is combined with the latch circuit LTC of FIG. 17. In addition thereto, a source follower circuit SF is provided between the LTC and the GA for impedance conversion. In this circuit, the input signal can be pre-amplified by the common gate amplifier, and the input capacitance of the latch-type amplifier is small. Therefore, there is an advantage of making it possible to increase the signal amount and perform an operation of a wide margin at a high speed. Furthermore, since the source-follower circuit is provided, it is possible to reduce coupling noise added from a differential MOS transistor of the latch amplifier to the input terminal at the time of starting the latch amplifier. Still further, input and output of the latch amplifier LTC are separated in this main amplifier, so that the output node of the latch amplifier can be pre-charged to the VCL. Therefore, the gate of the NMOS in the GIO buffer is in a cut-off state at the VSS, so that before the LT is inputted and the latch fixes data, if the GBE is inputted and the GIO buffer is activated, the GIO buffer can be driven only at the timing of the latch. Accordingly, an access can be made at a higher speed.

Second Embodiment

Figure 20:
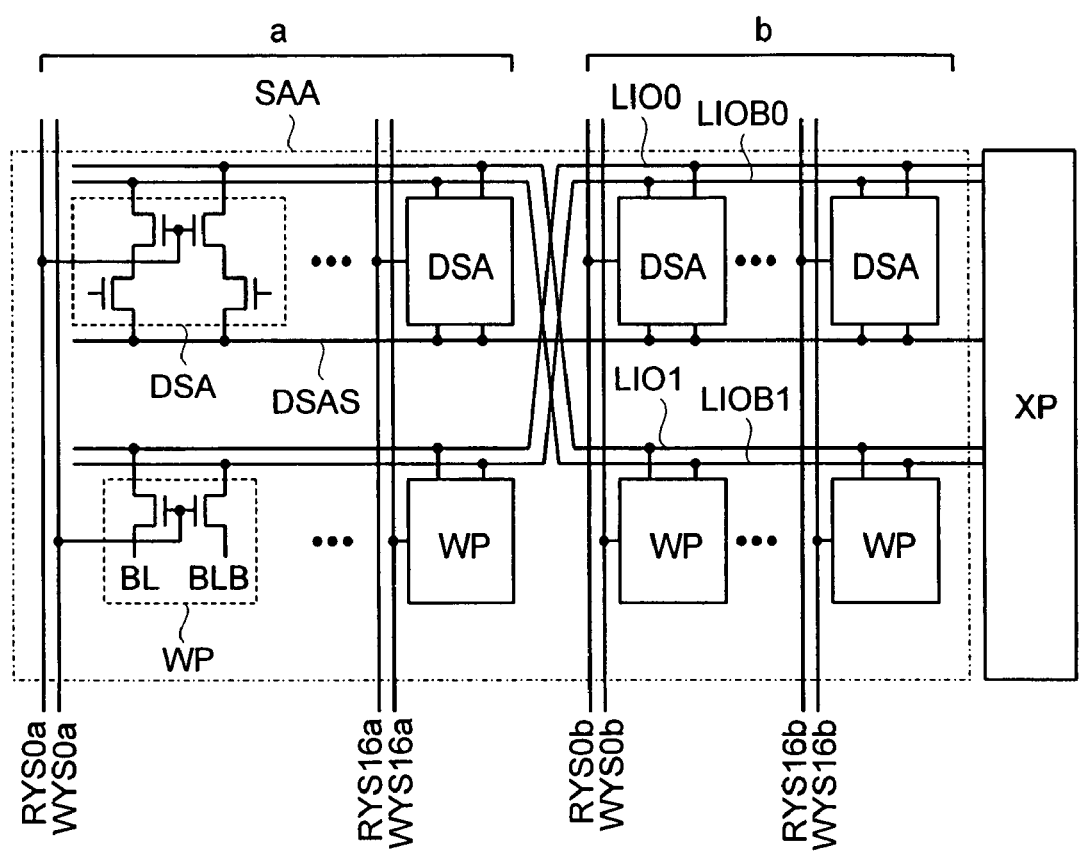
FIG. 20 shows a connection method of a second local IO according to the present invention.

FIG. 20 shows a connection method of a second local IO according to the present invention. By using this connection method, when the direct sense amplifier DSA and the write circuit WP in one sense amplifier SA are connected to different local IO lines, data of two bits can be read from one sense amplifier column during the reading and writing by using two set of LIO line pairs.

For this reason, the sense amplifiers are divided into a group "a" and a group "b" at a center of one sense amplifier column SAA. In the group "a", the write circuit WP is connected to one local IO line pair LIO0/LIO0B, and the direct sense amplifier DSA is connected to the other local IO line pair LIO1/LIOB1. Conversely in the group "b", the write circuit WP is connected to the local IO line pair LIO1/LIO1B, and the direct sense amplifier DSA is connected to the other local IO line pair LIO1/LIOB1.

During the reading, when one RYS is activated from each of the groups "a" and "b", the data from the sense amplifiers in the group "a" is read to the LIO0 and LIOB1, and data from the sense amplifiers in the group "b" is read to the LIO0 and LIOB0. During the writing, when one WYS is activated from each of the groups "a" and "b", data can be read to the sense amplifiers in the group "a" by using the LIO0 and LIOB0 and data can be read to the sense amplifiers in the group "b" by using the LIO1 and LIOB1. In contrast, when the plurality of RYSs are activated in FIG. 7, pieces of data read from the plurality of sense amplifiers collide with one another on the same LIO. Also, when the plurality of WYSs are activated in FIG. 10, the same data is written in the plurality of sense amplifiers. Therefore, according to the connection method for the local IO of the present invention as shown in FIG. 20, the number of bits readable or writable from one sense amplifier column can be increased twice without increasing the number of wirings of the LIO lines.

Third Embodiment

Figure 21:
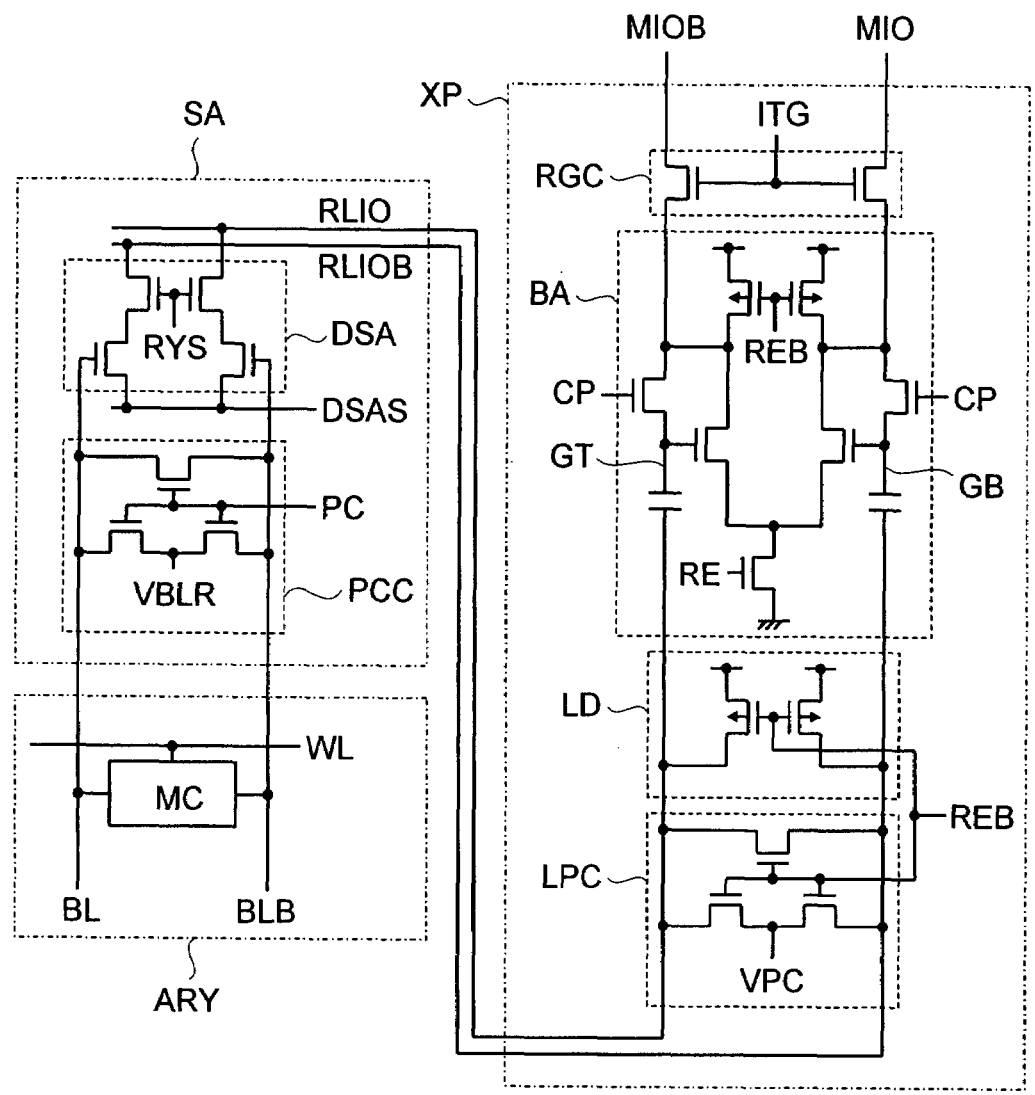
FIG. 21 shows a second data path structure according to the present invention.

FIG. 21 shows a second data-path structure according to the present invention. In the data path according to the present invention, since an offset-compensated sub amplifier is disposed in a connection portion of a local IO line and a main IO line, the offset of the direct sense amplifier can be compensated without providing an offset compensation for the direct sense amplifier itself. A memory array ARY and a sense amplifier SA therein are identical to those shown in FIG. 1, and therefore only respective portions thereof are illustrated. What is different in the present invention is that a sub amplifier BA is provided in the cross area XP. The other circuits except the cross area are the same to those of FIG. 5 and therefore are omitted in FIG. 21.

Figure 22:
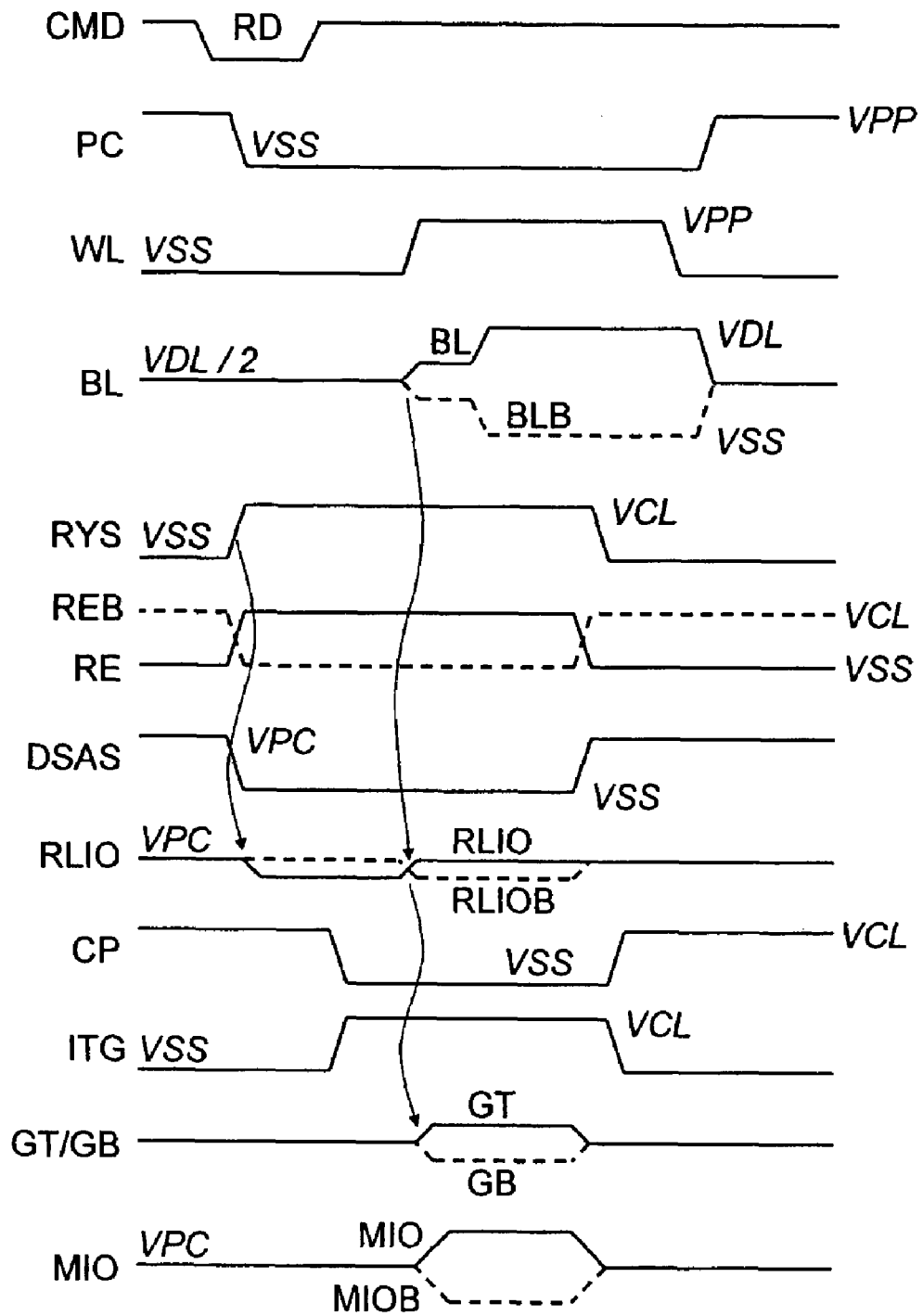
FIG. 22 shows operation waveforms on the second data path during the reading.
Figure 23:
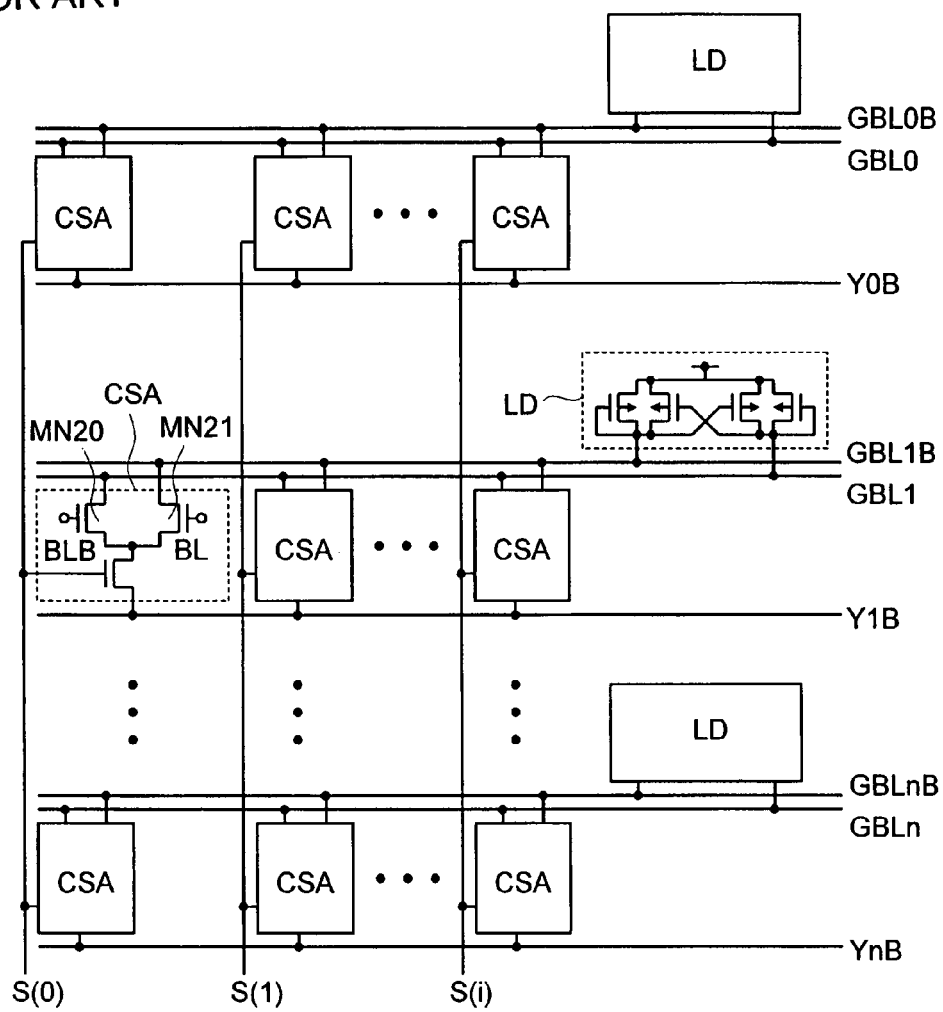
FIG. 23 is a block diagram of a column sense amplifier scheme of a conventional SRAM.

An operation of the data path according to the present invention will be described by using operation waveforms of FIG. 22. When the read command RD is inputted, the pre-charge signal PC is deactivated at the VSS. Almost at the same time, the read enable signal RE is activated at the VCL and the REB is activated at the VSS, whereby the sub amplifier BA is started. Furthermore, since the DSAS is driven from the VPC to the VSS, the direct sense amplifier DSA is activated. At this time, the bit line, which is an input of the DSA, remains pre-charged at the VDL/2. Therefore, when the read column select line RYS is activated, a signal corresponding to an offset of the direct sense amplifier occurs on the read local IO lines RLIO/RLIOB. At this moment, a compensation signal CP is at the VCL, and input terminals GT and GB of the sub amplifier connected to the LIO and a decoupling capacitance are short-circuited from output terminals thereof to be fixed at an offset compensation potential. The offset of the sub amplifier itself is compensated at this moment.

Next, after the CP is deactivated at the VSS to set the sub amplifier in an amplifiable state, the word line WL is activated, thereby causing a signal from the memory cell to occur between the bit lines BL/BLB. The direct sense amplifier amplifies it and outputs the signal to the RLIO and RLIOB. At this time, since signals occurs on the GT and GB via a decoupling capacitance, a voltage in which variations of the RLIO and RLIOB are added to the offset compensation potential occurs. Therefore, a signal, in which a reference is set as a potential difference between the RLIO and RLIOB at an instant at which the CP is dropped to the VSS, occurs, so that a net RLIO signal without the offset of the direct sense amplifier is obtained. Accordingly, it is possible to compensate for the offset of the direct sense amplifier. The sub amplifier amplifies the potential difference between the GT and GB for the output to the MIO and MIOB.

Thus, to make the offset compensation, the decoupling capacitance and a pass transistor are required. However, if they are provided to the individual direct sense amplifiers, the area of each sense amplifier is extremely increased. By using the data-path structure according to the present invention, the operation margin during the reading can be enhanced while the chip size is kept small.

The present invention described above can be used in a high-speed random access memory such as a DRAM or SRAM, particularly, in a memory that the signal read from the memory cell to the bit line is transmitted to a peripheral circuit at a high speed by a gate-input amplifier. However, the present invention can be used in a non-volatile memory such as a FLASH, FERAM, or MRAM to increase the speed of reading. Furthermore, in the on-chip memory incorporated in a microprocessor or a logic chip such as the DSP, since speeding up of the access time is required with improvement of the clock frequency, there are strong demands for improving the speed-up more than a stand-alone memory. Therefore, it is effective that the present invention is applied thereto.

As described above, the invention made by the present inventors has been specifically described. However, needless to say, the present invention is not limited to the above-mentioned embodiments and can be variously altered and modified without departing from the gist thereof.

Main effects obtained from the present invention will be as follows.

Firstly, in the random access memory, since the direct sense amplifier is selectively activated, the power consumption can be significantly reduced during the read operation. Then, since the load capacitance of the local IO line can be reduced, the reading speed can be made faster. Furthermore, data pattern dependency of the load capacitance of the local IO line during the read operation is reduced, so that a post-manufacturing test is facilitated.

Secondly, the noise in the direct sense amplifier during a high-speed operation can be reduced, and thereby the operation margin can be enhanced. Thirdly, the number of bits to be read from a single memory array can be doubled without increasing the chip size.

INDUSTRIAL APPLICABILITY

The present invention can be used in a high-speed random access memory such as a DRAM or SRAM, particularly, in a memory that the signal read from the memory cell to the bit line is transmitted to a peripheral circuit at a high speed by a gate-input amplifier. Also, the present invention can be used in a non-volatile memory such as a FLASH, FERAM, or MRAM to increase the speed of reading. Furthermore, it can be applied to not only a memory stand-alone chip but also the on-chip memory incorporated in a microprocessor or a logic chip such as the DSP.

The invention claimed is:

1. A semiconductor memory device comprising:
a first amplifier circuit having first and second N-channel MOS transistors and first and second P-channel MOS transistors; and
a second amplifier circuit for amplifying, to a power-supply voltage amplitude, information read from a memory cell,
wherein a gate of said first N-channel MOS transistor and a gate of said second N-channel MOS transistor are connected to a first power-supply potential, a source of said first N-channel MOS transistor is connected to a first input terminal, and a source of said second N-channel MOS transistor is connected to a second input terminal,
a gate of said first P-channel MOS transistor and a gate of said second P-channel MOS transistor are connected to a ground potential, a source of said first P-channel MOS transistor and a source of said second P-channel MOS transistor are connected to said first power-supply potential,
a drain of said first N-channel MOS transistor is connected to a drain of said first P-channel MOS transistor, and a drain of said second N-channel MOS transistor is connected to a drain of said second N-channel MOS transistor, and
said first and second N-channel MOS transistors receive inputs of the information read from said memory cell prior to said first and second P-channel MOS transistors.

2. The semiconductor memory device according to claim 1, wherein said semiconductor memory device further comprises a first circuit including third to sixth N-channel MOS transistors,
a gate of said third N-channel MOS transistor is connected to the drain of said first P-channel MOS transistor, a gate of said fourth N-channel MOS transistor is connected to the drain of the second P-channel MOS transistor,
a source of said third N-channel MOS transistor and a source of said fourth N-channel MOS transistor are connected to said second amplifier circuit,
a drain of said third N-channel MOS transistor and a drain of said fourth N-channel MOS transistor are connected to said first power-supply potential,
a gate of said fifth N-channel MOS transistor and a gate of said sixth N-channel MOS transistor are connected to a second power-supply potential,
said fifth MOS transistor and a drain of said sixth MOS transistor are connected to said second amplifier circuit, and
a source of said fifth MOS transistor and a source of said sixth MOS transistor are connected to said ground potential.

* * * * *